(12) United States Patent
Biegner et al.

(10) Patent No.: US 9,801,289 B2
(45) Date of Patent: Oct. 24, 2017

(54) MODULE FOR A TIRE PRESSURE MONITORING SYSTEM

(71) Applicants: Johannes Biegner, Prichsenstadt (DE); Jens Graf, Schweinfurt (DE); Laurens Verhulst, Utrecht (NL)

(72) Inventors: Johannes Biegner, Prichsenstadt (DE); Jens Graf, Schweinfurt (DE); Laurens Verhulst, Utrecht (NL)

(73) Assignee: AKTIEBOLAGET SKF, Gothenburg (SE)

( * ) Notice: Subject to any disclaimer, the term of this patent is extended or adjusted under 35 U.S.C. 154(b) by 207 days.

(21) Appl. No.: 14/672,362

(22) Filed: Mar. 30, 2015

(65) Prior Publication Data

US 2015/0282335 A1    Oct. 1, 2015

(30) Foreign Application Priority Data

Mar. 31, 2014    (DE) .................. 10 2014 205 921

(51) Int. Cl.
| | |
|---|---|
| H05K 7/00 | (2006.01) |
| H05K 5/00 | (2006.01) |
| H05K 5/02 | (2006.01) |
| H05K 5/06 | (2006.01) |
| B60C 23/04 | (2006.01) |

(52) U.S. Cl.
CPC ....... *H05K 5/0004* (2013.01); *B60C 23/0486* (2013.01); *B60C 23/0496* (2013.01); *B60C 23/0498* (2013.01); *H05K 5/0247* (2013.01); *H05K 5/065* (2013.01)

(58) Field of Classification Search
CPC ........................................................ H05K 5/00
USPC ..................................................... 361/679.01
See application file for complete search history.

(56) References Cited

U.S. PATENT DOCUMENTS

| | | | | |
|---|---|---|---|---|
| 5,928,767 A | * | 7/1999 | Gebhardt | B32B 15/08 174/258 |
| 2010/0079937 A1 | * | 4/2010 | Iizuka | G06F 1/1662 361/679.08 |

* cited by examiner

*Primary Examiner* — Jerry Wu
(74) *Attorney, Agent, or Firm* — Bryan Peckjian; SKF USA Inc. Patent Dept.

(57) ABSTRACT

A module includes a first partial housing and a second partial housing, wherein the first partial housing and the second partial housing together form a recess, a circuit board disposed in the recess; and an encapsulation mass, which closes the recess. A material from which the first partial housing is manufactured and a material from which the second partial housing is manufactured have a difference in thermal expansion coefficients that is at most 10% of the largest value of the two thermal expansion coefficients, the first partial housing includes a sealing structure and the second partial housing includes a counter-sealing structure, and at least one of the sealing structure and the counter-sealing structure is configured to extend into the other of the sealing structure and the counter-sealing structure.

20 Claims, 21 Drawing Sheets

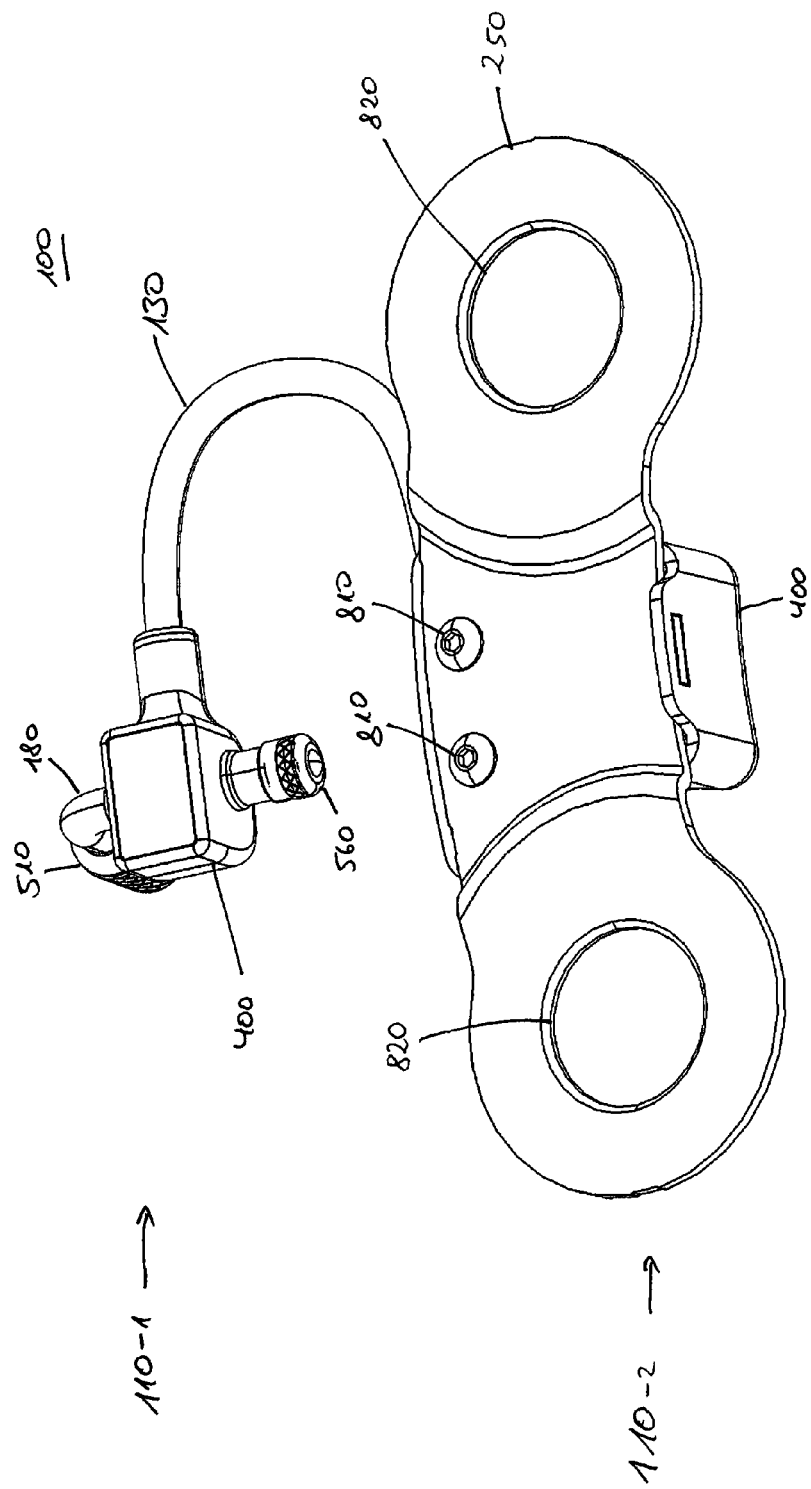

MODULE FOR A TIRE PRESSURE MONITORING SYSTEM

CROSS-REFERENCE

This application claims priority to German patent application no. 10 2014 205 921.6 filed on Mar. 31, 2014, the contents of which are fully incorporated herein by reference.

TECHNOLOGICAL FIELD

Exemplary embodiments relate to a module.

BACKGROUND

In many fields of technology, for example, in mechanical-, systems-, and vehicle-engineering, electronic and electrical components are used in areas wherein severe environmental conditions can prevail, such as, for example, moisture, dust, mechanical stresses due to vibrations, foreign bodies, and other potentially harmful influences.

Corresponding components are therefore often produced as modules and integrated as such. Examples arise in machine engineering, systems engineering, and vehicle engineering.

There is therefore a need to provide a module that makes possible an easy integratability, an easy manufacturability, a high resistance or robustness, a high reliability, and a high precision of the circuit implemented in the module.

SUMMARY

A module according to an exemplary embodiment includes a first partial housing and a second partial housing, wherein the first partial housing and the second partial housing together form a recess. The module further comprises a circuit board disposed in the recess and an encapsulation mass (filling compound), which closes the recess. Here a material from which the first partial housing is produced and a material from which the second partial housing is produced have a difference in thermal expansion coefficients that is at most 10% of the largest value of the two thermal expansion coefficients. The first partial housing includes a sealing structure, and the second partial housing includes a counter-sealing structure, wherein the sealing structure and the counter-sealing structure are configured to engage in each other.

Such a module according to an exemplary embodiment is based on the recognition that an easy manufacturability and integratability of the circuit board and the infrastructure required for its operation can be made possible by the providing of the first partial housing and the second partial housing, wherein the recess wherein the circuit board is disposed is closed by the encapsulation mass (sealing compound). In order, for example, to reduce or completely prevent an ingress of moisture or dust, the partial housings include their sealing structure or counter-sealing structure, which engage in each other in the assembled state and thus, despite their multi-part embodiment, due to the sealing structure make more difficult or even make impossible an ingress of corresponding contaminants, such as moisture and dust. In order to exhibit a desired sealing even under different environmental conditions, i.e., for example, different temperatures, it is advisable here to use materials for the first and second partial housing whose thermal expansion coefficients do not differ from each other, or differ at most by the above-mentioned value.

A module according to a further exemplary embodiment comprises a housing, a circuit board disposed completely inside the housing, and a flexible cable, which comprises at least one partial cable provided for guiding a signal, wherein the at least one partial cable is indirectly or directly electrically connected to a contact location of the circuit board. The partial cable has a curved course in the housing between a first reference point and a second reference point.

Such a module according to an exemplary embodiment is based on the recognition that due to the implementation of the curved course of the partial cable in the housing, a probability of damage due to a mechanical stress acting on the cable or the partial cable can be reduced. In this way it can be possible to improve a reliability or robustness of the module or the circuit implemented therein, wherein relatively simple technologies are used. As a result, an easier manufacturability and, due to the achievable improvement in robustness, optionally also an easier implementability of the module can be realized.

BRIEF DESCRIPTION OF THE DRAWINGS

Exemplary embodiments are described and explained in more detail below with reference to the accompanying Figures:

FIG. 20 shows the tire monitoring system from a back side after the manufacturing process/step shown in FIG. 19.

DETAILED DESCRIPTION

Figure 1:
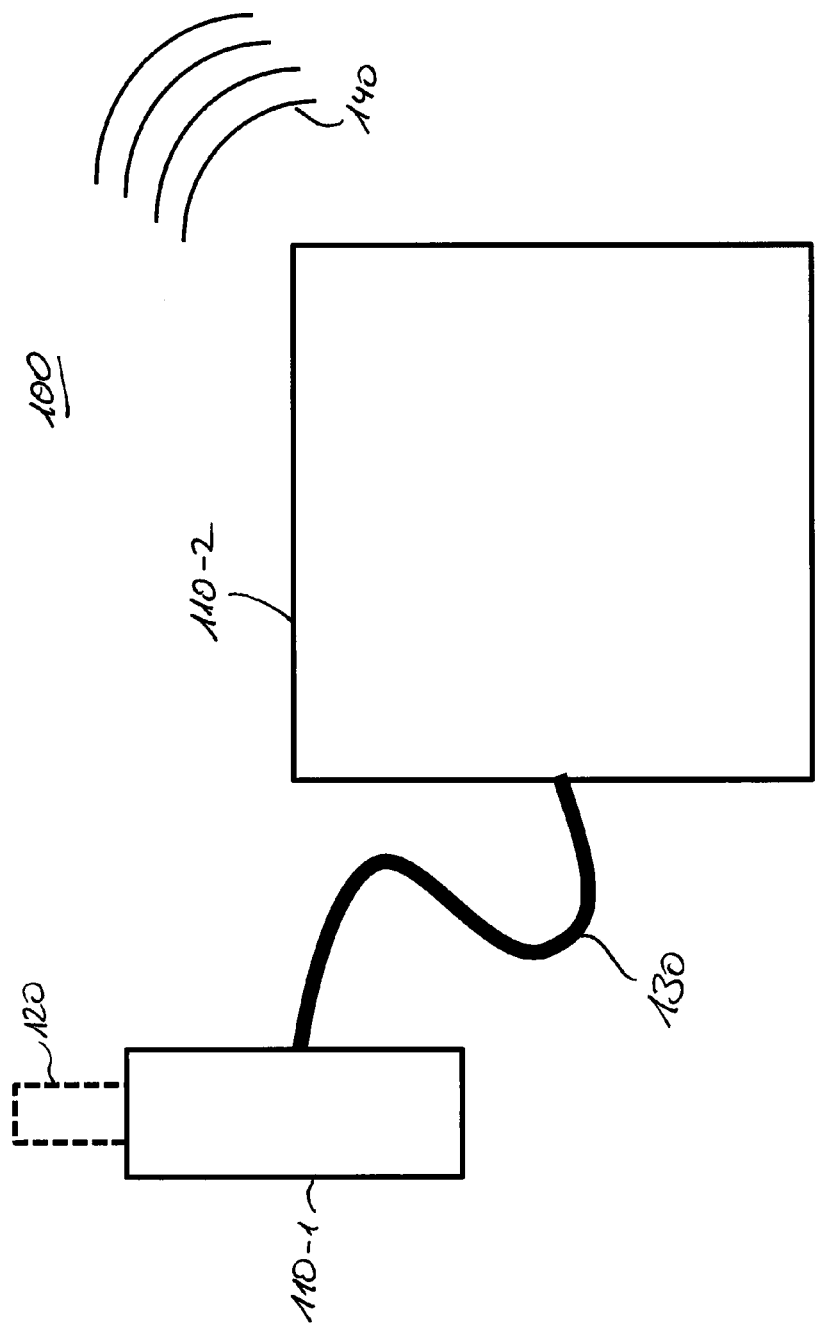
FIG. 1 shows a schematic block diagram of a tire monitoring system according to an exemplary embodiment.

In the following description of the accompanying Figures, like reference numbers refer to like or comparable components. Furthermore, summarizing reference numerals are used for components and objects that appear multiple times in an exemplary embodiment or in an illustration, but that are described together in terms of one or more common features. Components or objects that are described with the same or summarizing reference numbers can be embodied identically, but also optionally differently, in terms of individual, multiple, or all features, their dimensions, for example, as long as the description does not explicitly or implicitly indicate otherwise.

In the following, representative, non-limiting examples of systems, modules, and other components are described that can be used in a variety of applications in the fields of mechanical-, system-, and vehicle-engineering. They can be used, for example, in the context of tires of a vehicle. In other words, the description of a tire monitoring system and its components will be described in more detail below; the tire monitoring system and its components can be used, for example, for monitoring tire pressure and tire temperature, as well as the vibrational behavior of a wheel of a truck or other vehicle. However, other and/or further physical values can also optionally be captured/sensed that can relate to the tire, its fill (pressure) state, or other components, for example a bearing or a wheel of a vehicle.

However, the present exemplary embodiments are not limited to use in trucks. Rather, the present teachings can also be applied to or used in other motor vehicles, e.g., in automobiles, motorcycles, light motorcycles, and buses. The present teachings can also be applied to or used in other land-based vehicles, for example in trailers, bicycles, mountain bikes, rail vehicles, machinery, agricultural machinery, and other vehicles. Moreover, the present teachings are also not limited to the vehicle field. Rather, the present teachings can also be applied to and used in machines and systems. Thus, even though a tire monitoring system is described in detail in the following, embodiments of the present teachings are by no means limited to tire monitoring systems for trucks or other motor vehicles.

An important parameter that is monitored in tires of trucks and other motor vehicles is the tire pressure in the interior of the tire when the tire is filled with a gaseous medium, i.e. a gas or gas mixture. A tire monitoring system that is used for monitoring the tire pressure is thus also referred to as a tire pressure monitoring system (TPMS). Such tire monitoring system can also measure further parameters, for example, the temperature of the tire or of its gaseous filling. A tire monitoring system can thus, for example, primarily be used for monitoring the temperature and the air pressure for each individual tire of a truck and its trailer(s), wherein the tire monitoring system can be attached, for example, to an outer side of the wheel rim, i.e. outside the interior of the tire. However, if such a sensor or a corresponding module is disposed outside of the tire, there is always a risk of air leakage.

For example, in the case of trucks, the tire pressure can be significantly higher, for example in the range of approximately 8 bar, than for automobiles. Moreover, the operating environment of these vehicles can be harsher than for corresponding automobiles. Especially with off-road trucks, i.e. trucks suitable for all-terrain use, mud, dirt, snow, and similar environmental conditions can place additional strain or burden on tire monitoring systems therefor and possibly influence the sealing of the tire. Thus, for example, such vehicles may be exposed to a significantly higher risk of being hit by rocks, e.g., by pebbles and other solid objects.

Herein, the tire monitoring system can transmit data wirelessly, i.e., for example, by radio (electromagnetic waves or signals). If the same module is used here for both data capture/sensing and wireless transmission, it can be advisable for reasons of weight and stability to use a plurality of components and modules, especially for use outside the tire. As a result, however, such designs may require that hoses/tubes/pipes outside the tire are permanently under pressure, and such hoses/tubes/pipes in turn have corresponding interfaces to the respective components. A risk of pressure leakage due to the plurality of required interfaces, e.g., the interface between the valve and a valve extension, the interface between the valve extension and the hose, as well as the interface between the hose and the corresponding sensor module and further internal interfaces in the region of the pressure sensor, which is configured, for example, as an SMD (SMD=surface-mount device=component attached to the surface), can thus lead to a corresponding increase in the risk of pressure leakage.

FIG. 1 shows a schematic block diagram of a tire monitoring system 100 for monitoring a tire. Here the tire monitoring system 100 comprises a first module 110-1, which is configured to sense/detect at least one physical value with regard to the tire (not shown in FIG. 1) and to provide/output a measurement signal based on the at least one sensed physical value. In order to illustrate this in more detail, FIG. 1 shows an optional connector 120 via which the first module 110-1 can be fluidly coupled to a valve of the tire such that the first module is in fluid contact (communication) with the interior of the tire, in order to directly sense the at least one physical value. Due to this fluid communication, the fluid (e.g., gas) in the interior of the tire can enter/reach the first module 110-1.

In the tire monitoring system 100 the first module 110-1 can be configured so as to be mechanically connectable to a valve of the tire. In such a case the first module 110-1 also can be configured to fill the interior of the tire with a fluid (e.g., a gas).

The tire monitoring system 100 further comprises a second module 110-2, which is electrically coupled to the first module 110-1 via a flexible cable and is configured to capture/receive the measurement signal of the first module 110-1 and wirelessly transmit an information signal 140 based on the measurement signal. In this way the information signal 140 can be wirelessly transmitted, for example, by radio (electromagnetic wave).

In this embodiment, the measurement signal can be transmitted via the flexible cable 130 from the first module 110-1 to the second module 110-2. The transmission can occur, for example, using electrical signals via an electrical conductor (e.g., a metal wire). Of course, in other examples other transmission techniques can be used to transmit the measurement signal via the flexible cable. Thus, for example, the measurement signal can also be optically transmitted from the first module 110-1 to the second module 110-2, e.g., via a fiber optic cable. Depending on the specific implementation/design, communication in the opposite direction can also be provided, i.e. from the second module 110-2 to the first module 110-1, in order, for example, to initiate the measuring or sensing of the physical value by the first module 110-1. Other control commands can also optionally be transmitted from the second module 110-2 to the first module 110-1. Such control commands, for example, can provide instructions for a reset operation or another system-related function.

Modules 110 according to the present teachings can be configured for example, to be directly connectable to a wheel or a component of the wheel. A module can thus be configured—as shall be explained in more detail below—to be mechanically connectable to a rim of the wheel, to a wheel carrier/support for the wheel or also to a valve of the tire of the wheel. A module can thus comprise, for example, a housing that, in a state provided for operation, does not have an opening for an electrically conducting component or supply line. In this case, the module 110 or its electrical supply lines are thus isolated/shielded by the housing from environmental influences.

Figure 2:
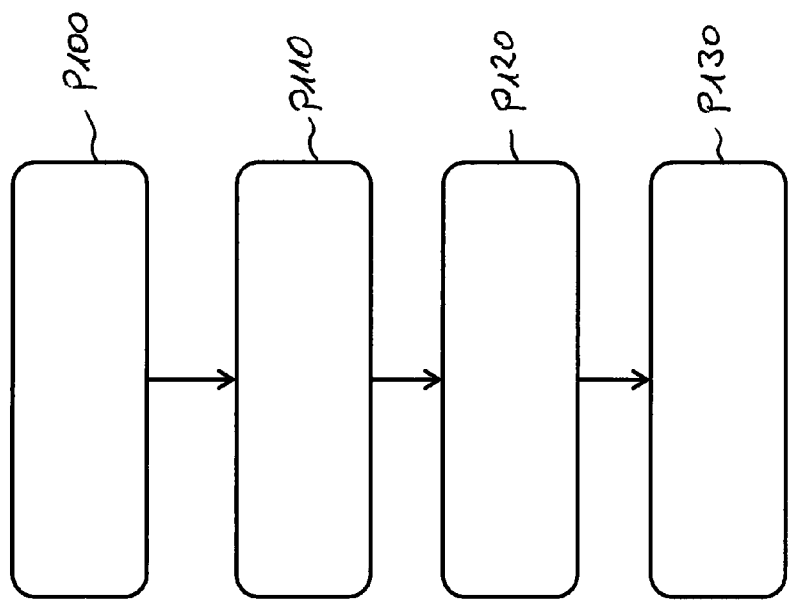
FIG. 2 shows a flowchart of a method according to an exemplary embodiment for monitoring a tire.

FIG. 2 shows a flowchart of a representative method for monitoring a tire. The method comprises, in step/process P100, sensing/detecting/capturing at least one physical value with regard (relating) to the tire in a first module 110-1 (not shown in FIG. 2). In the next step/process P110, a measurement signal is generated in the first module 110-1 based on the at least one sensed physical value. In the next step/process P120, the measurement signal is transmitted to a second module 110-2 that is electrically coupled to the first module 110-1 via the flexible cable 130. In the next step/process P130, an information signal 140 based on or representative of the measurement signal is wirelessly transmitted.

In an exemplary embodiment of this method, the above-mentioned steps/processes can be carried out in the order specified, or optionally in a different order. Moreover, the individual steps/processes can optionally occur simultaneously, or at least partially overlapping in time.

In the context of the present disclosure, a "mechanical coupling" of two components comprises/encompasses both direct and indirect couplings. Electrical or other components are coupled indirectly via a further component or directly to one other such that they facilitate an information-carrying signal exchange between the relevant components. The corresponding coupling can thus be partially (sectionally) or completely implemented and realized, for example, electrically, optically, magnetically, or using radio technology. With respect to their range of values as well as their duration, the signals here can be continuous, discrete, or, for example, comprise both types in portions thereof. They can be, for example, analog or digital signals. Furthermore, a signal exchange can also occur via a writing or reading of data in registers or other storage locations.

As shown in FIG. 1, the first module 110 represents a module for detecting/sensing/capturing a physical value of the gaseous medium that, in the application described there, originates in the interior of the tire. Such a module 110-1 is shown in a greatly simplified schematic cross-section in FIG. 3.

Figure 3:
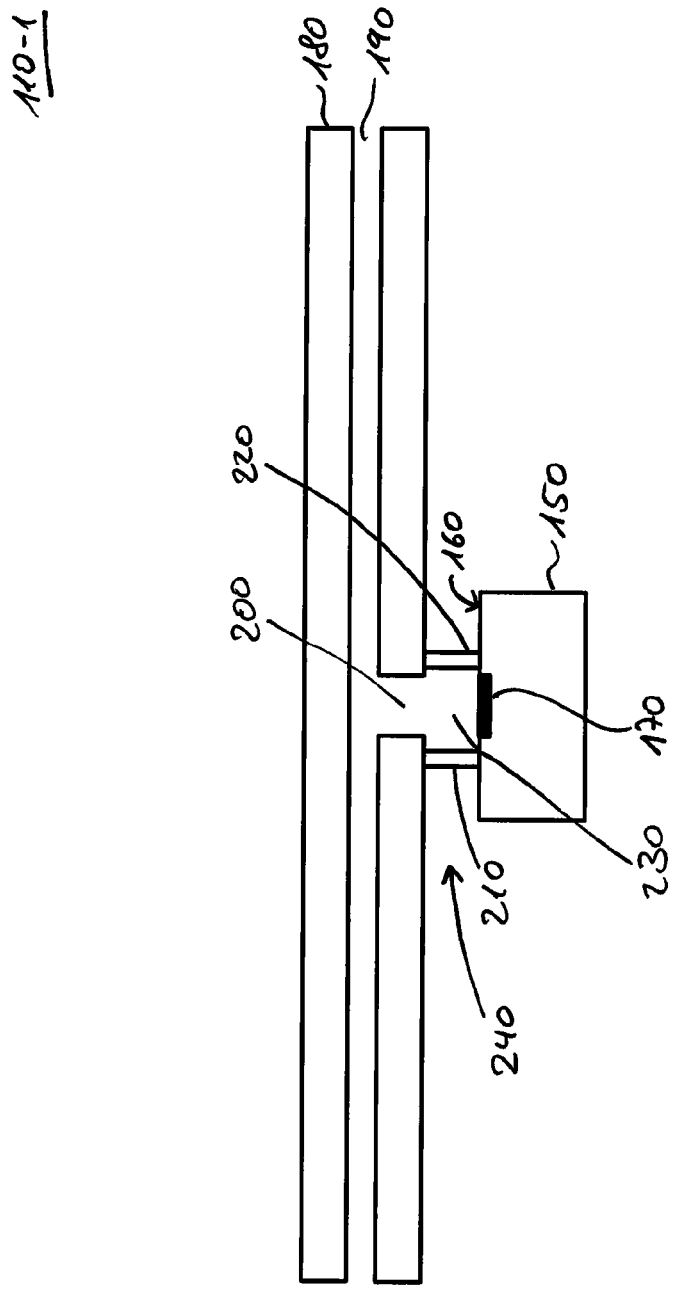
FIG. 3 shows a schematically simplified cross-sectional depiction of a module for sensing a physical value of a gaseous medium according to an exemplary embodiment.

As shown in FIG. 3, the module 110-1 comprises a discrete component 150, which includes a detection section/portion 170 on a surface 160. Here the discrete component is configured to sense/detect/capture one or more physical values of the gaseous medium that acts on the detection section/portion 170. For example, the detection section/portion 170 can form a portion of the surface 160 of a housing of the discrete component 150. If the discrete component 150 has, for example, an opening, cutout, or hole in its housing through which the gaseous medium can come into contact with the discrete component 150 in such a manner that it can measure and determine the physical value(s), the detection section/portion 170 can be formed by or comprise the surface of the opening. Thus, for example, if the relevant sensor element(s) is/are disposed in the housing of the discrete component 150, the gaseous medium can advance to (reach) the sensor element(s) via the detection section/portion 170.

However, the detection section/portion 170 can also lie on a surface in the interior of the housing of the discrete component 150, via which surface the indirect or direct contact of the gaseous medium with the sensor element(s) disposed on or inside the surface can occur.

In principle, a "physical value" can be any physical value that is determinable using a corresponding discrete component. A physical value can thus be, for example, a pressure, a temperature, an intensity of an electromagnetic radiation, etc. A discrete component can be, for example, can be one that is integratable into an electrical circuit. This discrete component can be, for example, indirectly or directly attached to a circuit board in order to be connected thereto mechanically and such that information/data/signals can be communicated. The communication of information/data/signals can take place, for example, electrically, optically, magnetically, or based on other signals that are usable for information transmission. If such a discrete component comprises, for example, a sensor for a physical value, such a component may require calibration or inspection/verification. In this case, its data can be stored in the component in a storage (memory) provided for or usable for this purpose. A discrete component can thus, for example, have undergone a calibration or inspection/verification, and thus comprise corresponding calibration data or verification data.

The module 110-1 further comprises a supply-line component (conduit) 180, which is configured to guide the gaseous medium onto the detection section/portion 170. As shown in FIG. 3, the supply-line component 180 includes a channel 190 for this purpose which is fluidly connectable to the interior of the tire or another source or another reservoir for the gaseous medium. In addition, the supply-line component 180 has an opening 200 which makes possible an influx or ingress of the gaseous medium from the channel 190 to the detection section/portion 170. The opening 200 is thus fluidly coupled or connected to the channel 190 of the supply-line component 180.

The module 110-1 further includes a seal 210, which is in contact with the supply-line component 180 and with the surface 160 of the discrete component and fluidly seals the detection portion/section 170 on the surface 160 of the discrete component 150. As shown in the example in FIG. 3, the seal can include a seal lip 220, which is configured to enclose (surround or encircle) the detection section/portion 170 such that the seal forms a sealed chamber 230, which comprises the detection section/portion 170 and is separated by the seal from an external space 240 surrounding the seal. A greater tolerance compensation can be made possible, for example, by using such a seal 210. This can lead, for example, to a reduction of the forces exerted on the discrete component by the seal 210, whereby for example, a reduction of the preload or of the mechanical stress of the discrete component 150 can thus be made possible. The flexible seal lip 220 can thus serve, for example, to compensate for manufacturing tolerances. Due to the V-shaped structure of the seal 210 and its seal lip 220, the sealing can optionally be realized for different spacings between the chamber bottom and sensor surface without a large increase or reduction of the preload in the system. Thus, for example, the pins of the pressure sensor (discrete component 150) can be mechanically stressed as little as possible, and nevertheless a large dimensional tolerance range can be made possible in the preloading direction.

Moreover, if a flow-through of the gaseous medium is not necessary, a comparatively small opening 200 and thus a seal 210 having small dimensions, for example, with respect to its diameter, can be used. In this way a limiting of the forces acting on the discrete component 150 can be achieved, and thus, for example, also on a circuit board on which the component 150 is mechanically and electrically attached.

As was shown in FIG. 1, the second module 110-2 of the tire monitoring system 100 can, for example, also be configured as a module 110 for capturing/detecting the vibrational behavior of a mechanical component. The mechanical component can be, for example, the wheel of the truck or also a corresponding wheel bearing.

Figure 4:
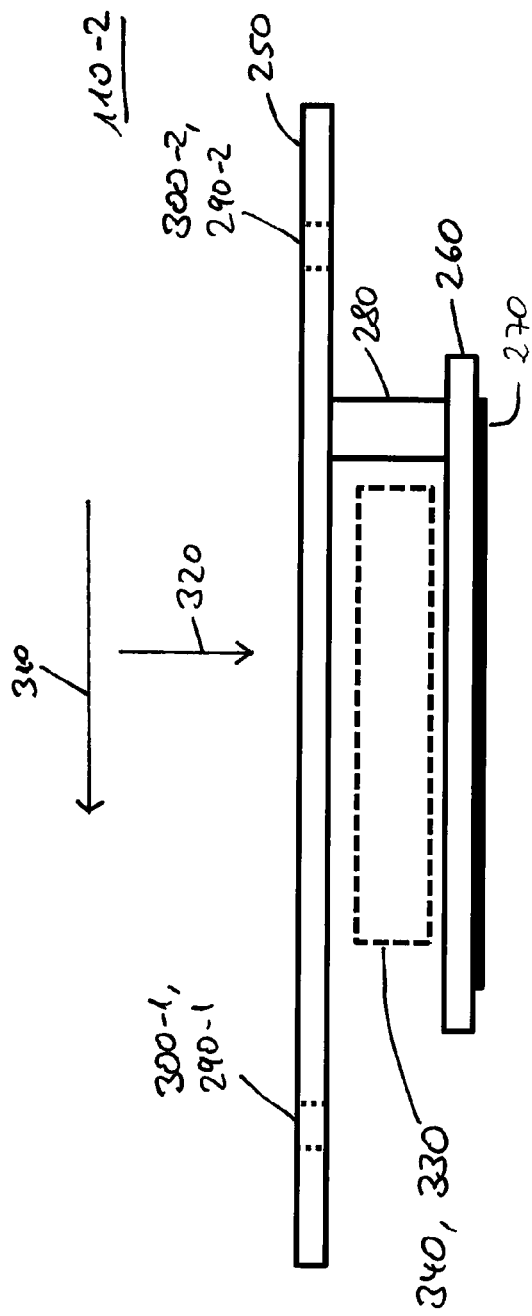
FIG. 4 shows a schematic cross-sectional depiction through a module for sensing the vibrational behavior of a mechanical component according to an exemplary embodiment.

FIG. 4 thus shows a schematic cross-sectional depiction through the module 110-2, which is also designed to capture/detect the vibrational behavior of a mechanical component (not shown in FIG. 4). For this purpose the module 110-2 comprises an attachment component 250, which is configured to be fixedly mechanically connected to the component in order to absorb mechanical vibrations from the component. The module 110-2 further includes a circuit board 260, which in turn comprises a circuit 270, which is configured to capture/detect the mechanical vibrations of the mechanical component and to wirelessly transmit, based on the sensed vibrations, a signal comprising the vibrational behavior. Furthermore, the module 110-2 includes at least one spacer 280, which mechanically connects the circuit board 260 to the attachment component 250 such that the mechanical vibrations of the attachment component 250 are transmitted to the circuit board 260.

The transmission of the signal comprising the vibrational behavior can also optionally occur here by radio (wirelessly via electromagnetic waves). In this way it can be possible to make possible a relatively simple implementation of such a module 110-2 into an existing system. In addition, in retrofitting such a system so as to be wireless, it is not necessary to provide a cable space for electronically transmitting the relevant signals.

In this embodiment, the at least one spacer 280 can optionally be configured to rigidly connect and fix the circuit board 260 to the attachment component 250. In this way the spacer 280 or the at least one spacer 280 can thus not only serve to transmit the mechanical vibrations from the attachment component 250 to the circuit board 260, but can also serve to mechanically fix and thus mechanically suspend the circuit board 260 and the included circuit 270. Depending on the specific design, the at least one spacer 280 can be manufactured from a metallic material such as, e.g., a metal or a metallic alloy. Such a metallic alloy can comprise, for example, in addition to a metallic material, further metallic materials or elements, but also non-metallic elements or materials. Steel or brass, for example, are representative examples of such an alloy. Metallic materials can thus, for example, be electrically conductive, although these can also be surrounded, for example, by a non-conducting or electrically insulating layer.

Depending on the specific requirements profile, the attachment component 250 can also be manufactured, e.g., from a metallic material. Additionally or alternatively, it can also be made from an electrically conductive material. In order to securely couple the attachment component to the mechanical component (not shown in FIG. 4), the attachment component 250 can optionally be configured such that it is connectable to the mechanical component at least two locations 290-1, 290-2, which are spatially separated from one another. In the example shown in FIG. 4, the attachment component 250 can thus, for example, include an opening or bore 300-1, 300-2 at each of the locations 290; using these openings or bores 300-1, 300-2 the attachment component 250 can, for example, be screwed onto a wheel rim of a truck. Thus, for example, for installation on a wheel or a wheel rim of a truck or of another vehicle, the module 110-2 can be screwed onto two threaded bolts disposed adjacently along the circumferential direction of the rim or of the wheel; the wheel rim, for example, can also be attached to a wheel support via the threaded bolts.

As defined herein, two objects are "adjacent" if no further object of the same type is disposed between them. Objects are "directly adjacent" if they adjoin or abut one another, for example, they are in contact with one another.

The attachment component 250 can be manufactured, for example, as a metal-plate part. If it is manufactured from a metallic material or another electrically conductive material, a coupling of the module 110-2 that is suitable for detecting/capturing the vibrational behavior can optionally be achieved with a relatively simple structure.

However, independent thereof the attachment component 250 can also have an extension (length) along a predetermined direction 310 that is greater than an extension (length) of the circuit board 260 along the predetermined direction. In this case, the circuit board 260 can be disposed below or above the attachment component 250 along a projection direction 320 perpendicular to the predetermined direction 310.

Additionally or alternatively to such a design of the attachment component 250, the module 110-2 can (also) comprise a component 330 that is disposed between the circuit board 260 and the attachment component 250. In a projection of the component 330 along the projection direction 320 perpendicular to the circuit board 260, at least 30% of a total surface of the projection of the component 330 can be at least partially produced from electrically conductive material. In this case, the total surface of the projection of the component 330 can correspond to at least 30% of the total surface of a projection of the circuit board 260 along the projection direction 320. Independently of each other, in other examples the two above-mentioned percentage values can also correspond to at least 50%, at least 70%, at least 80%, at least 90%, at least 95%, or 100%, which in the last case corresponds to a complete projection.

In other words, the component can include a significant proportion of an electrically conductive material, which can lead to the following effects, similar to with a corresponding design of the attachment component 250. The electrically conductive material here comprises, for example, a metallic material, as was already mentioned above.

The component 330 can thus, for example, be an energy source 340, which is disposed between the circuit board 260 and the attachment component 250. This energy source 340 can be coupled to the circuit 270 of the circuit board 260 in order to supply the circuit 270 with electrical energy (current). The energy source 340 can be, for example, an electrochemical energy source, for example, a battery or an accumulator. The energy source 340 shown in FIG. 4 can, for example, be or comprise a button (battery) cell.

Especially in the case of a wireless transmission of the signal comprising the vibrational behavior, interference effects in the wireless transmission of the signal, for example, in the wireless transmission of the signal by radio (electromagnetic waves), can result from the integration (inclusion) of a relatively large metallic mass, as can be embodied by such an energy source 340 or even by the attachment component 250 itself. Thus, for example, the circuit 270 can also comprise an antenna, which is configured to transmit the signal comprising the vibrational behavior.

In this embodiment, the circuit 270 can comprise conductors on or integrated into the circuit board 260, discrete components and parts, as well as integrated circuits as corresponding discrete components. Thus the circuit 270 can comprise, for example, a discrete component, which is configured to sense/capture the mechanical vibrations.

Due to the use of the spacer 280, enough installation space is created, for example, for the component 330, which may be e.g., the energy source 340. Therefore, that the module 110-2 can be constructed smaller and more compact, without the component 330 interfering with the radiation characteristics of the antenna, which can be implemented, for example, in the circuit 270 and/or without the surface of the module 110-2 having to be significantly enlarged. Due to the implementation or usage of the at least one spacer 280, it can also be possible, independent of the implementation or incorporation of a corresponding component 330 including the energy source 340, to improve the radiation characteristics of the signal comprising the vibrational behavior.

Of course, the module 110-2 can also comprise a housing that encloses the circuit board and thus, for example, protects the circuit board 260 and its circuit 270 from damage and other harmful influences.

Figure 5:
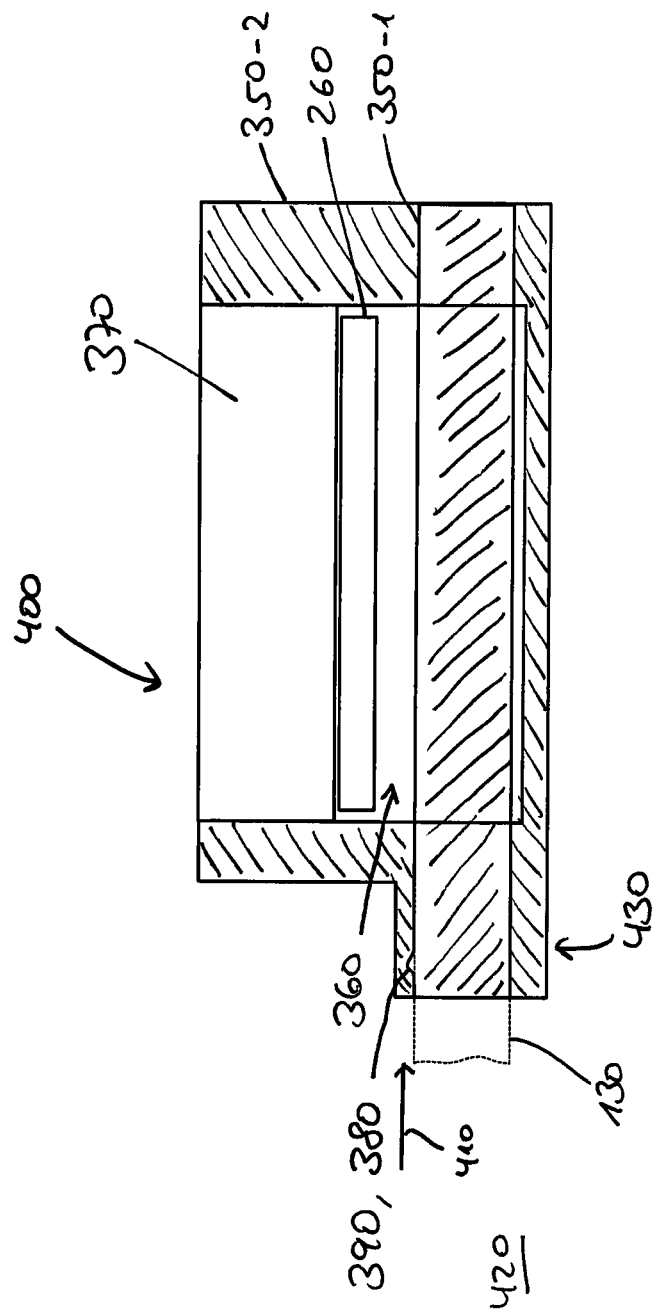
FIG. 5 shows a schematic cross-sectional depiction through a module according to an exemplary embodiment.

A housing for such a module 110, such as can be used, for example, as a housing for the module 110-1 and/or for the module 110-2 of the tire monitoring system 100 from FIG. 1, is schematically depicted in FIG. 5. The module 110 in FIG. 5 includes a first partial housing 350-1 and a second partial housing 350-2, which together form or define a recess 360. A circuit board 260 is disposed in the recess 360. An encapsulation mass (filling compound) 370 closes the recess 360. In this embodiment, the material from which the first partial housing 350-1 is produced and the material from which the second partial housing 350-2 is produced have a difference in thermal expansion coefficients that is at most 10% of the largest value of the two thermal expansion coefficients. In other examples the aforementioned value can also be at most 5%, at most 2%, or at most 1%. The thermal expansion coefficients can, for example, also be identical, if, for example the same or at least a very similar material is used for the materials of the two partial housings 350-1, 350-2. In this embodiment, the first partial housing 350-1 includes a sealing structure 380, and the second partial housing 350-2 includes a counter-sealing structure 390, which are precisely formed such that they engage in each other. In this way it can be possible that the two partial housings 350-1, 350-2, together with the encapsulating mass, form a housing 400, which at least partially protects the circuit board 260 and a circuit optionally implemented thereon or therein from the influence of moisture, dust, and other external influences. It can thereby be possible to make possible the use of such a module 110, even under severe environmental conditions, using relatively simple technologies, without the manufacturing of the module 110 thereby being made significantly more difficult. Thus, for example, the first partial housing 350-1 can be used as a preform or premold for fitting of the resulting housing 400 with components, which in FIG. 5 are indicated as optional components only in the form of the flexible cable 130. In this way it can be possible to utilize the finished module 110 even under adverse environmental conditions, and thus make the implementation easier overall.

The second partial housing 350-2 can then be formed in an injection molding process or in an overmolding process around the first partial housing 350-1. The first partial housing and the second partial housing can thus, for example, represent injection molded parts. Although in the foregoing description the first partial housing 350-1 was considered to be a preform (premold), of course this can also apply to the second partial housing 350-2. In other words, from a set of partial housings 350, which comprises the first partial housing 350-1 and the second partial housing 350-2, one of the two partial housings can be a preform part for another partial housing of the set of partial housings.

As is also indicated in FIG. 5, the sealing structure 380 or the counter-sealing structure 390 can include at least one elevation and/or at least one depression. These can be designed, for example, asymmetric, in order to thus make more difficult an ingress of moisture, dirt, and other contaminants along the interface of the two partial housings 350. Along direction 410, which leads from an external space 420 of the housing 400 into the recess 360, the asymmetry of both the elevations or recesses can be designed such that a steeper flank is present on the side facing towards or away from the recess. By providing the sealing structure 380 and the corresponding counter-sealing structure 390, it is possible to extend the path that contamination must travel from the external space 420 in order to be able to penetrate into the recess and thus into the region of the circuit board 260. Of course, in this case the sealing structure 380 can include a plurality of elevations and/or depressions disposed one-behind-the-other. In a corresponding manner, the counter-sealing structure 390 can also include a plurality of depressions and/or elevations disposed one-behind-the-other, which can optionally have a form (shape) that corresponds to those of the elevations or depressions of the sealing structure 380. The term "one-behind-the-other" can refer to the direction 410 from the external space 420 into the recess 360 or also to the opposite direction.

The first partial housing 350-1 and the second partial housing 350-2 can include cable feeding sections 430 which are configured to introduce the flexible cable 130 at least to the recess 360. The sealing structure and the counter-sealing structure can be disposed on the cable feeding sections 430 of the first partial housing 350-1 and of the second partial housing 350-2. Thus the sealing structure 380 and the counter-sealing structure 390 can be implemented precisely in such a region wherein, for example, an increased degree of deformation of the two partial housings 350 due to the movement of the flexible cable 130 could be expected due to movement of the flexible cable 130. Thus precisely in this region a slight ingress of contaminants into the recess 360 can occur.

Moreover, in order to optionally also realize a mechanically more stable implementation of a module 110 with respect to mechanical stresses along the flexible cable 130, in such a module 110 a strain relief can also optionally be implemented, as is described in more detail below in connection with FIG. 6.

Figure 6:
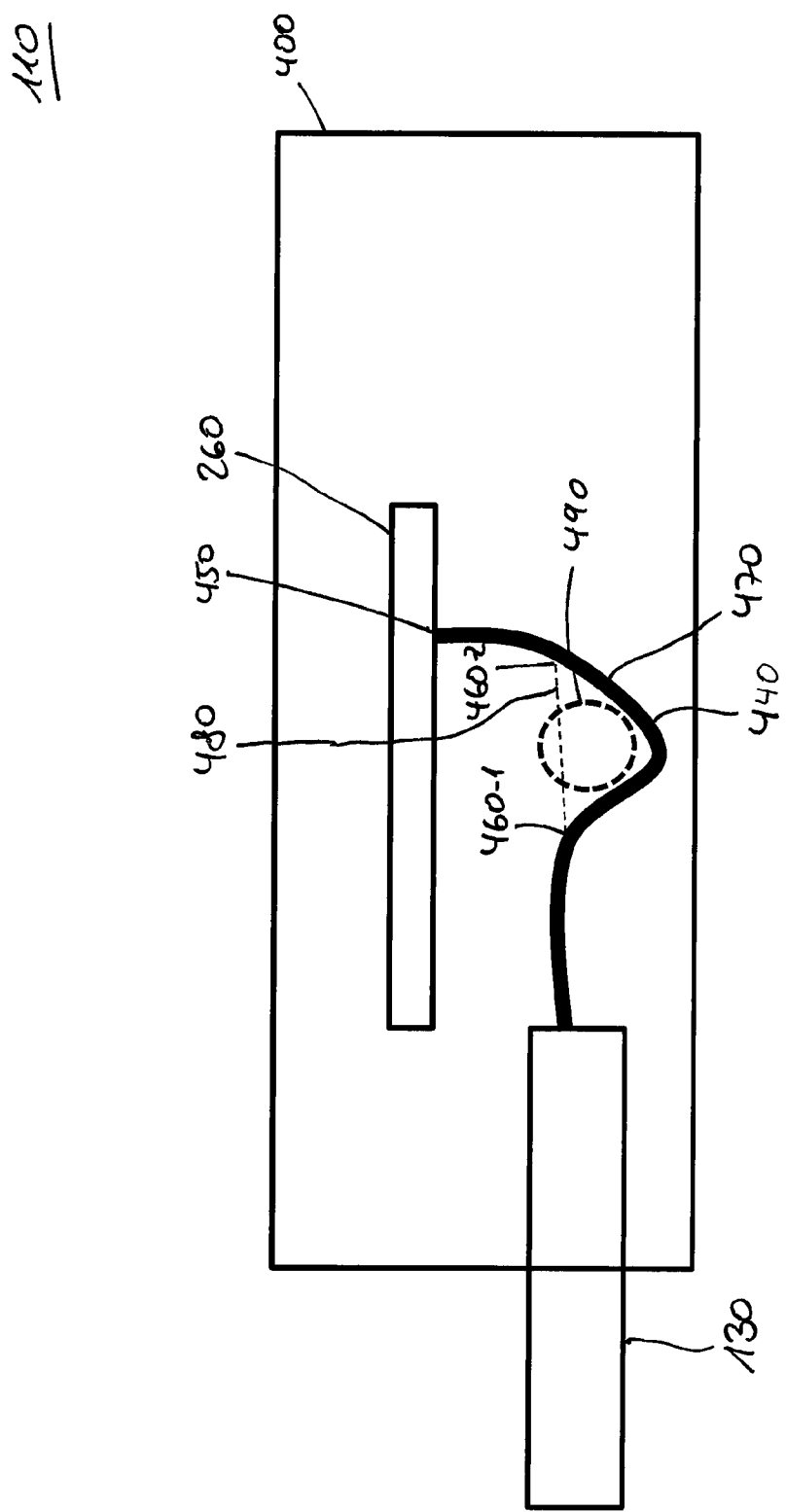
FIG. 6 shows a schematic simplified cross-section through a module according to an exemplary embodiment.

Thus FIG. 6 shows a schematic cross-sectional depiction of a module 110, which includes a housing 400, a circuit board 260 disposed completely inside the housing 400, and a flexible cable 130. Here the flexible cable 130 includes at least one partial cable 440 provided for guiding a signal, which partial cable 440 is indirectly or directly electrically connected to a contact terminal 450 of the circuit board 260. In the housing 400 the partial cable 440 extends along a curved course 470 between a first reference point 460-1 and a second reference point 460-2, as compared to a line 480 drawn between the two reference points 460 in FIG. 6 illustrates. For example, the curved course 470 can extend at least over an angle of at least 90°.

As a result, when a mechanical stress, such as a tensile or compressive stress, acts on the flexible cable 130 or on the at least one partial cable 440, it can yield, if necessary, in the interior of the housing 400 without the indirect or direct electrical connection to the contact terminal 450 being mechanically stressed too greatly. In this way the reliability or robustness of the design with respect to mechanical stresses, which can occur, for example, during operation, can thus be increased, if necessary.

Optionally the module 110 can include a support component 490, which can, for example, be the supply-line component 180, and wherein the curved course 470 extends at least partially around the support component 490. Depending on the specific implementation, the support component 490 can also include a recess, for example, in order to guide the partial cable 440 around the support component 490.

It may be desirable for the partial cable 440 to contact the support component 490. It can thereby be possible to transmit a mechanical force, which acts on the flexible cable 130 or the partial cable 440, to the support component 490 via frictional forces or other forces. If necessary, a force can thus be transmitted directly to the housing 400 via a mechanical coupling of the support component 490 thereto. On the other hand, if the partial cable 440 is not in contact with the support component 490, the strain relief functionality can be realized since the partial cable 440 may be more easily movable as a result.

Optionally the at least one partial cable 440 can also be at least partially, i.e. partially or also completely, surrounded between the first reference point 460-1 and the second reference point 460-2 in the region of the curved course 470 by an encapsulation mass 370 and/or the housing 400, for example in the form of the first and/or of the second partial housing 350-1, 350-2. As a result it can be possible to enlarge the contact surface between the encapsulation mass 370 and the partial cable 440 with respect to a straight line between the two reference points 460 so that a friction-fit-, materially-bonded-, and/or interference-fit-connection between the encapsulation mass 370 and the respective partial cable 440 can be increased. The same also applies, for example, for implementations in which the flexible cable is completely or partially surrounded between the two reference points 460 in the region of the curved course 470. In this case the friction-fit-, materially-bonded-, and/or interference-fit-connection between the encapsulation mass 370 and the flexible cable can form or at least facilitate the corresponding strain relief. The same also applies for the overmolding of the flexible cable or of the partial cable 440 during the overmolding itself when forming one or more of the partial housings 350.

Such a friction-fit-, materially-bonded-, and/or interference-fit-connection between the encapsulation mass 370 and the partial cable 440 or the flexible cable can be achieved, for example, by exploiting the shrinkage behavior during the cooling phase of the encapsulation mass 370. Due to this shrinkage effect "frictional forces" due to the overmolding of the cable or its partial cable 440 caused by shrinkage during cooling can be realized and utilized. The length of the overmolded cable can be, for example, at least 10 mm, at least 20 mm, or at least 30 mm.

The overmolding can also optionally be a melting of the cable 130 or of the partial cable(s) 440, whereby, for example, an at least partial materially-bonded connection is achieved. This can be achieved, for example, by using material for the sheath of the cable 130 or of the partial cables 440, which partially or completely softens, melts, or fuses at a temperature used during overmolding. In this way a materially-bonded connection can arise between the first partial housing 350-1, the second partial housing 350-2, and/or the encapsulation mass 370 and the sheath of the flexible cable 130 or the sheath of the partial cable(s) 440 by the sheath melting on at least one of the components mentioned, thus forming the materially-bonded connection.

The injection temperatures used during the overmolding of the partial housing 350 can be chosen based upon the selection of the corresponding material(s) such that an easy melting of the partial cable(s) 440 results, however without the partial cable(s) 440 melting completely, in order to provide a better connection therebetween. This can apply independently for the first partial housing 350-1, the second partial housing 350-2, both partial housings 350, and/or for further partial housings 350.

A partial cable can comprise, for example, a wire, an insulated wire, a strand, a plurality of strands, or also one or more glass fibers, or one or more cables that make possible signal-conduction, or another line that makes possible signal-conduction. It can be protected electrically, optically, or in another manner with respect to further partial cables 440 against a corresponding transmission of the signal between the individual partial cables. Thus such a partial cable can be electrically insulated, for example by electrical insulation, for example a paint insulation/enamel or another coating. Of course, in the flexible cable 130, multiple, e.g., two, three, or more partial cables 440 can also extend parallel to one another. Depending on the specific implementation, they can always extend parallel, or else be twisted or rotated inside the flexible cable 130.

The signal transmission in the flexible cable 130, and thus its partial cable(s) 440, can therefore be effected electrically, but also optically or in another manner, provided, for example, a fluidic isolation is implemented between the first module 110-1 and the second module 110-2 with respect to the gaseous medium of the tire in the case of a tire monitoring system 100.

Moreover, by using the encapsulation mass 370 (not shown in FIG. 6), which is in contact with one or more partial cables 440 and/or the contact location(s) 450, it can optionally also be possible to reduce or even completely prevent ingress of water and other contaminants that could reach the circuit board 260 by traveling along the partial cable 440. Due to the additional material contact between the encapsulation mass 370 and the partial cables 440 or the contact terminals 450, which can comprise, for example, an electrical contact- or plug-connection, ingress of impurities into the electrically conducting regions can optionally be made more difficult or even prevented.

Even though different aspects were presented in the context of FIGS. 1 to 6, these aspects can be implemented in different combinations in exemplary embodiments. Thus in the following a tire monitoring system 100, which is more specifically a tire pressure monitoring system (TPMS), is described in more detail, which implements the above-mentioned aspects. However, as was already explained above, the present teachings are by no means limited to a tire monitoring system 100. Rather, aspects, functions, features and embodiments of the present teachings can also be implemented in conventional tire pressure monitoring systems or tire monitoring systems 100, whereas not all of the above-mentioned aspects need be implemented also in a tire monitoring system 100 according to an exemplary embodiment.

Thus in the following a specific implementation is described in more detail of a tire pressure monitoring system, in the form of a pressure sensor, for trucks, which tire pressure monitoring system can be mounted on an outer side of a tire. Here the tire monitoring system 100 in question includes two modules 110. In one module, i.e. the first module 110-1, which is also referred to as the valve module, the pressure is measured or sensed, while the required infrastructure for wireless communication and optionally some further arithmetic operations, as well as the energy (power) supply, are disposed in a second module 110-2, which is also referred to as the main module. In this embodiment, the valve module (first module 110-1) is directly mounted on the rim valve of a wheel, while the main module (second module 110-2) is disposed on a flange diameter of the rim and is affixed by two adjacent wheel nuts. The two modules 110-1, 110-2 are electrically connected to each other via a flexible cable 130 comprising two partial cables 440-1, 440-2. In this embodiment, the flexible cable 130 includes exactly two partial cables 440.

In view of the harsh environmental conditions that such a system can encounter, in the design described below this system can make possible a strain relief and a sealing with respect to environmental influences as well as a simple hardware-fitting or hardware-manufacturing during production. For example, the strain relief and the sealing concept are described here in the following in more detail.

For example, in the following a tire monitoring system including a connecting-cable concept including a strain relief and an environmental enclosure concept is described in more detail. With respect to the sealing concept, in which the sensor in question—as mentioned—is mounted on an outer side of the tire, in an exemplary embodiment only one valve extension can be directly connected to the wheel rim valve. With respect to the internal design of the valve extension, which the first module 110-1 also represents, reference can be made to a conventional valve extension system, as appropriate. The outer form (shape) can be, for example, square or rectangular, or have another polygonal shape, and form a sealing chamber or a sealing space, which comprises an opening 200 into the internal design which is under pressure. In this embodiment, a mechanical stabilizing of the module can optionally be improved if the region of the valve extension (supply line component 180) that is surrounded by the housing is as large as possible. On the other hand, however, a smaller implementation, taking into account other effects and parameters, such as the available installation space, can also be useful.

A circuit board 260, which can be implemented, for example, as a printed circuit board (PCB), can be gripped by a plastic housing 400 and electrically connected via a flexible cable 130 to a second housing of the second module 110-2, which can be mechanically connected to the wheel rim via the wheel nuts via an attachment component, which is also referred to as a base plate. As a result it can optionally be possible to reduce, possibly even to minimize, the probability of an pressurized-air leak, by disposing the pressure sensor itself very close to the valve extension and by being sealed by a specially designed seal 210. Only one further comparatively very small seal—seal 210 for the pressure sensor—thus need be used, for example, to fluidly connect the system. Standard valve extensions can also often remain permanently attached in use, in order, for example, to facilitate the refilling (reinflation) of the tire, for example the so-called inboard tire in a twinned tire formation, which faces the inside of the vehicle. Also in this case only one further interface to the environment can optionally be implemented, even if the module 110 remains on the tire.

Besides the aforementioned printed circuit board, the circuit board 260 can also be configured as another board-type structure, whereon or wherein a circuit 270 is at least partially realizable. Here the circuit board can serve for mechanical receiving and/or connection, electrically or in another information-conveying manner, of a discrete component. The connection can be effected, for example, by soldering, welding, or another electrically conductive connection technology.

The tire monitoring system 100 described below thus includes two modules 100-1, 100-2, which serve to reduce the risk of a leak and can make possible a more flexible implementation on different wheel rim types with respect to the length and the radius of curvature of the cable connecting the module 110. In the first module 110-1 (valve module), which can be directly mounted on the wheel rim valve, the pressure and optionally further physical values are measured, while in the second module 110-2 (main module) the wireless transmission means is disposed, optionally some arithmetic operations are carried out, and the necessary energy (power) supply is disposed. The two modules 110-1, 110-2 are connected to each other via a flexible cable 130 comprising exactly two partial cables 440. Especially for harsh environmental conditions the design described below includes a strain relief and the already indicated environmental-sealing concept, while it can also optionally make possible an easy hardware fitting during manufacturing. Especially in the field of off-road trucks (all-terrain trucks), in which dirt, mud, snow, and similar environmental conditions can exert an additional strain on the system and can impair the cable robustness, an appropriate implementation can optionally be advisable.

The two modules 110-1, 110-2 described below are thus electrically connected to each other via a flexible cable 130 comprising exactly two partial cables 440. Thus, for example, cables specifically suited for automotive use, for example for ABS/ASR sensors (ABS=anti-lock braking system; ASR=anti-slip regulation) can be used.

As the following description will demonstrate, the number of interfaces under pressure, which could lead to pressurized-air leaks, can optionally be reduced, optionally even minimized. In addition, pressure losses due to a damaged pressure hose, if necessary, can also be avoided. The risk of a porous or leaking hose and the risk of a missing spare part of the respective hose can thus also optionally be avoided.

It can also optionally be possible to reduce or even avoid mechanical stressing of the circuit board 260, its interfaces, and the soldered regions, for example between the partial cables 440 and the additional press-fit contacts described below, due to a pulling or a pushing on the cable 130. In addition, adaptations to a large number of wheel rim types on the market can optionally be achievable with small modifications. Thus a tire monitoring system 100 can optionally be used with a large number of wheel rim types by using a flexible cable 130 due to its typically greater degree of bending flexibility. The greater flexibility of a cable can lead to (permit), for example, a smaller bending radius. As the following description shall also show, a fast assembly of the required hardware components in both modules 110 can also optionally be realizable here. A reduction or even a minimization of the number of interfaces under pressure, which can lead to pressurized-air leak, can also be effected.

Figure 7:
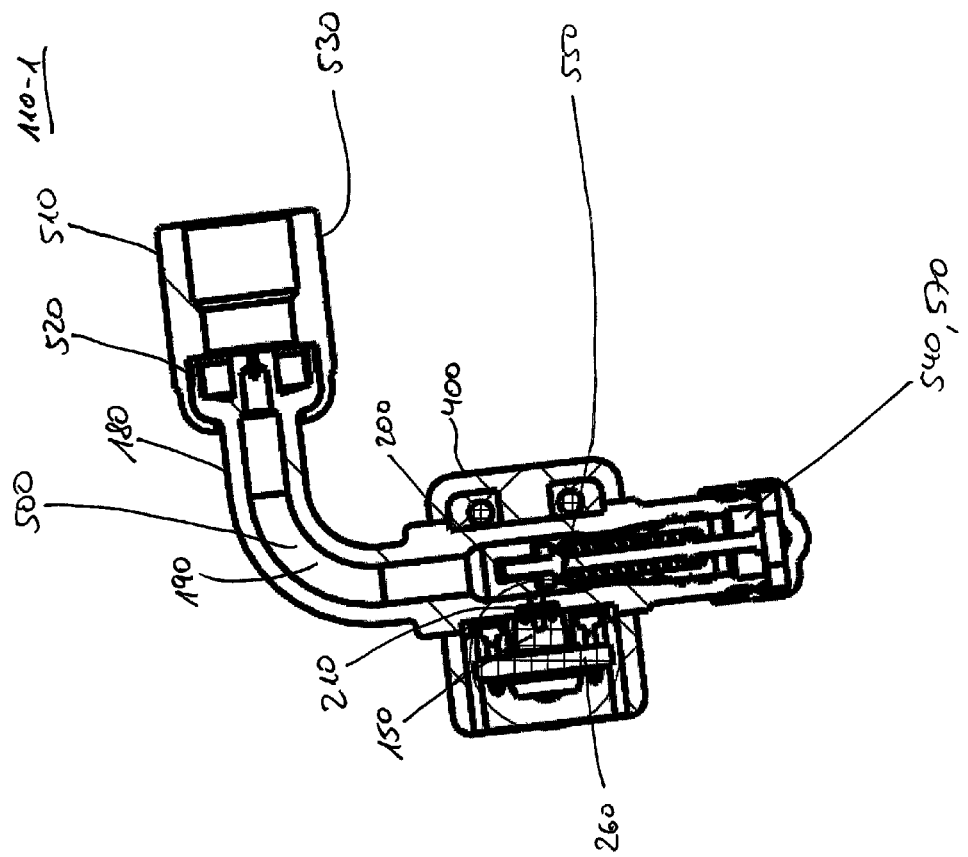
FIG. 7 shows a cross-sectional depiction through the first module of a tire monitoring system according to an exemplary embodiment.

FIG. 7 shows an overview of a region 500, which is under pressure, and the essential sealing components of the first module 110-1 of a tire monitoring system 100 according to an exemplary embodiment, which, however, is not shown in its entirety in FIG. 7. With respect to its sealing structure, the first module 110-1 (also referred to as the valve module) is based on an adapted valve extension, which is overmolded with a plastic housing 400 and then optionally sealed. Thus the module 110-1 includes a supply-line component 180, which the actual valve extension represents. Thus the supply-line component 180 includes an attachment structure 510, which is configured to make the module 110-1 connectable to a valve of a tire, wherein the valve makes possible a fluid connection to an interior of the tire, which interior is fillable or filled with the fluid. In this embodiment, the fluid can be, for example, a gaseous medium, i.e., for example, a gas or a gas mixture (e.g., pressurized air). The attachment structure 510 thus includes a tire valve interface 520 having a standard seal which is commonly used for this purpose. For the mechanical attachment of the attachment structure 510 or of the module 110-1 to the valve of the tire, the attachment structure 510 further includes a valve extension nut 530 having an appropriate guide surface in its interior. In the supply line component shown in FIG. 7, the channel 190 extends along a curved course (path) and leads to a valve insert 540, which is disposed on the end of the supply-line component 180 that is opposite the attachment structure 510. In region 550, which shall be described in more detail below, a seal 210 is disposed between the supply-line component 180 and a discrete component 150, which, for example, is configured as an SMD sensor, wherein the seal 210, as was described above, is in contact with a surface 160 (not shown in FIG. 7) of the discrete component 150 as well was with the supply-line component 180. The discrete component 150 represents here, among other things, the pressure sensor, which is electrically and mechanically connected to a circuit board 260. The circuit board 260 can be, for example, a printed circuit board (PCB), onto which the discrete component 150 is soldered.

The supply-line component 180 and the first module 110-1 thus differ from a conventional valve extension in that an opening 200 makes possible an access to the discrete component 150. Using the discrete component 150 the tire pressure, for example, can be determined. Of course, however, instead of the tire pressure, other physical values, for example the temperature, the chemical composition of the gas mixture, the air humidity, or another physical value can be detected/sensed/captured by the discrete component 150. Moreover, the supply-line component 180 includes a seal seat, which is configured to receive the seal 210 and protect against slippage. Additionally or alternatively, such a slippage can also be caused by aging effects, which can result in a flowing or yielding of the seal material of the seal 210. The use of the seal seat can thus additionally or alternatively counteract wear of the sealing effect of the seal 210 due to aging of the seal 210. The supply-line component 180 thus includes the seal seat 600, which can be configured to receive the seal 210 and protect against slippage of the seal 210 and/or against aging effects, for example in the form of a flowing (yielding) or a loss of the shape stability of the seal 210. The seal seat, which, however, is not shown in detail in FIG. 7, thus makes it possible to position and to fix the seal 210 between the discrete component 150 and the supply-line component 180.

Radial and axial closures (caps, fasteners, locks) can additionally be attached here, in order, for example, to also strengthen the interface between the housing 400 manufactured from plastic and the supply-line component 180 for the case of mechanical stresses. Extending the supply-line component 180, as compared to a standard valve extension, using an appropriate lead structure can optionally facilitate placement or installation of the TPMS valve module 110-1.

Figure 8:
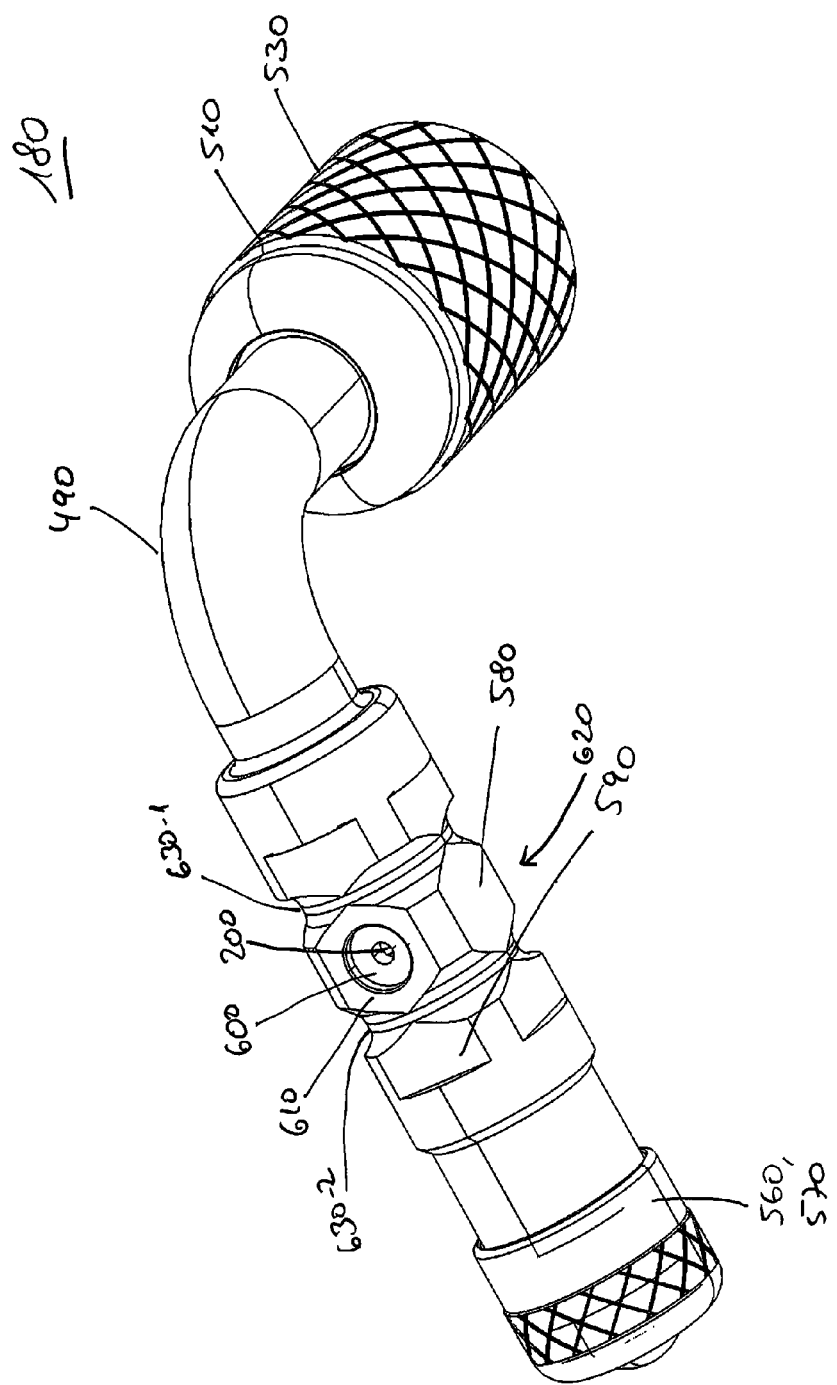
FIG. 8 shows a perspective depiction of the supply-line component.

FIG. 8 shows a perspective depiction of the supply-line component 180. Thus FIG. 8 also shows the attachment structure 510 together with the valve extension nut 530, which, for example, can include knurling for easier handling. This is covered by an end cap 560 on the side opposite the attachment structure 510, thus on which the valve insert 540 is disposed, which is not, however visible in FIG. 8. Even when the module 110-1 is installed, the pressure in the tire can thus be provided (communicated) via the valve insert 540. In other words, the module 110 further includes a valve 570, which is configured to make the gaseous medium in the interior of the tire refillable via the attachment structure 510.

In order to make forces that act on the housing 400 more easily conductible away to the supply-line component 180, the supply-line component 180 includes a radial turning lock 580 (a structure that can limit rotation when overmolded) as well as an axial turning lock 590 (a structure than can limit axial movement when overmolded). An interference-fit connection between the housing 400 and the supply-line component 180 can thus additionally result from the overmolding and optionally from the subsequent recasting of the housing 400. The radial turning locks can be at least partially formed, for example, by flat surfaces of the supply-line component 180. Edges 595 of such surfaces, which, for example, extend perpendicular to the axis of the supply-line component 180, can serve as axial turning locks.

A "friction-fit" connection results from static friction, a "materially-bonded" connection results from molecular or atomic interactions and forces, and an "interference-fit" connection results from a geometric connection of the respective connection partners. The static friction generally presupposes a normal force component between the two connection partners. This can happen, for example, by making use of the shrunken material during the cooling phase after the overmolding of the supply-line component 180, which can also serve as the valve extension.

In addition, FIG. 8 shows the opening 200 and the above-mentioned seal seat 600, which is configured to receive the seal 210. In the present exemplary embodiment the opening 200 is a bore, which leads directly into the channel 190 of the supply-line component 180; the seal seat 600 is a recess or a blind hole having a larger diameter than a diameter of the opening 200, into which the substantially rotationally symmetric seal 210 (not shown in FIG. 8) is insertable. This seal 210 projects out over a surface 610 of the supply-line component 180 in this region.

The supply-line component 180 thus includes a supply-line section 620, which is part of the supply-line component and is configured to introduce the gaseous medium directly to the discrete component 150, which is also not shown in FIG. 8. The supply-line section 620 here includes the above-mentioned bore or the opening 200 as well as the seal seat 600. The supply-line section is subsequently completely enclosed by the housing 400.

In the sense of the above-mentioned strain relief, the supply-line component 180 additionally represents the support component 490. Thus in the supply-line section 520 the supply-line component 180 includes two substantially encircling groove-shaped recesses 630-1, 630-2, around which two partial cables 440 of the flexible cable 130, which is also not shown in FIGS. 7 and 8, are guided. The groove-shaped recesses 630 can simultaneously serve as axial turning locks 590, i.e. serve for axial securing.

Figure 9:
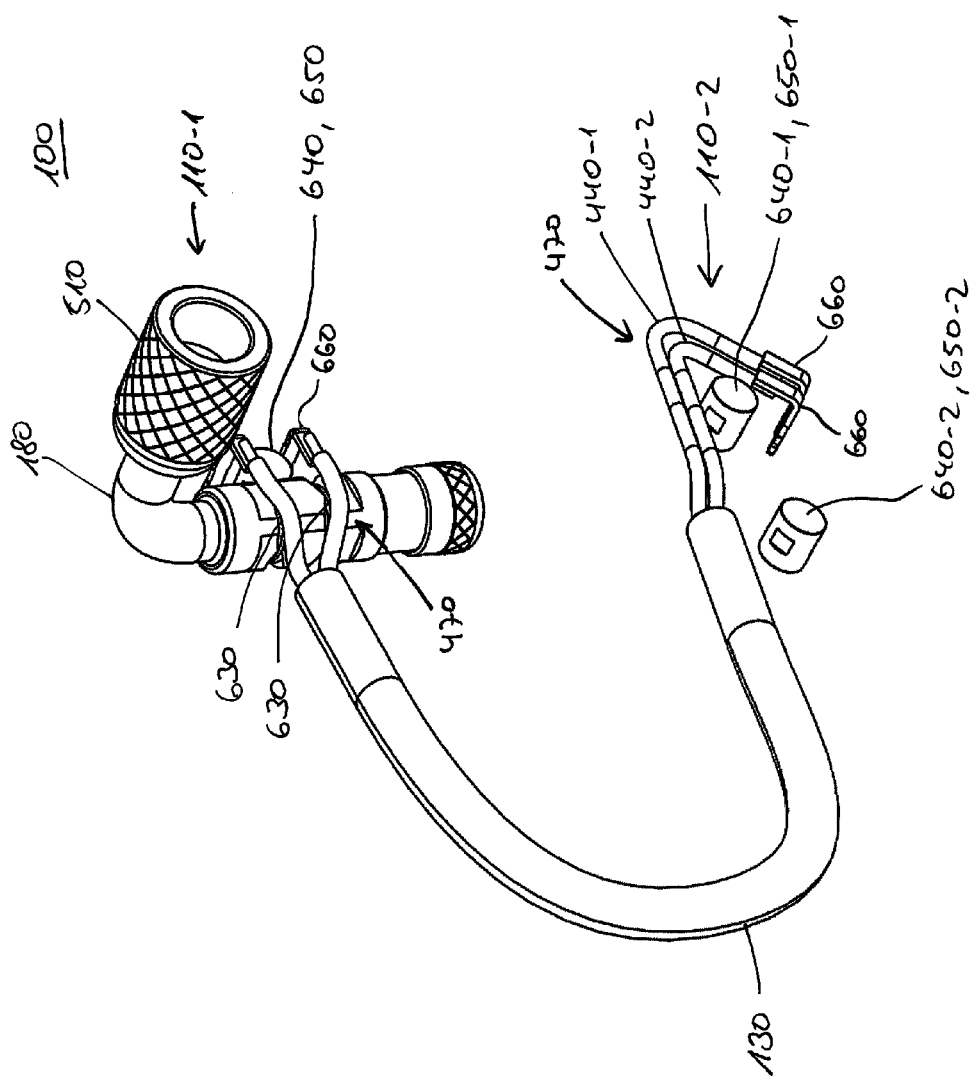
FIG. 9 shows a perspective depiction of the tire monitoring system in an early manufacturing process/step.

In the following the wiring concept as well as further details with respect to the tire monitoring system 100 are described in more detail. Thus FIG. 9 shows a perspective depiction of the tire monitoring system 100 in an early manufacturing process or step. At this point in time the first module 100-1 basically comprises the supply-line component 180 as well as a spacer component 640, which is part of a preloading structure 650. Here the preloading can be effected by the spacing. The preloading structure 650 can be formed by or comprise, for example, a socket or another corresponding structure as well as a screw element 770, which can press the circuit board 260 with the discrete component 150 against the seal lip 220 of the seal 210, which, however, are not depicted in FIG. 9. Since the spacing of the component 150 to the supply-line component 180 is precisely dimensioned such that the seal 210 presses against the component 150 in the desired manner, the preloading of the seal 210 can thus be achieved. Due to the above-described design of the seal 210 and its seal lip 220, it can optionally possible here to limit the stress on the component 150 and its supply lines, and nevertheless be insensitive even to large tolerances with respect to the spacing. Using the preloading structure 650 a minimum spacing between the relevant components, for example the brass bushing and the sealing chamber, can thus be set, for example. This can be determined, for example, using a beam deflection calculation. The second module 110-2 also comprises two spacer components 640-1, 640-2.

The subsequent housing 400 of the two modules 110-1, 110-2 will surround the preloading structures 650. The preloading structures 650 are then in the position or configured so as to exert a force on the circuit boards so that the seal 210 is preloadable against the supply-line component 180 by the mechanical attachment of the discrete component 150 onto the circuit board 260. For this purpose the preloading structures can also comprise, for example, one or more respective screw elements in addition to the above-mentioned spacer components 640. The respective spacer components 640 are configured here, for example, to form a stop for the circuit board 260. The screw elements and the spacer components 640 are together configured to press the circuit board 260 against the spacer components 640 such that the seal 210 is preloaded. The screw elements can include, for example, screws or also elements configured in a complex manner. Such a screw element can thus comprise an external thread that is in engagement with a corresponding internal thread. Of course, such a screw element can also include an internal thread, e.g., it can be configured as a nut.

Moreover, the two modules 110-1, 110-2 are connected to each other via the flexible cable 130, which comprises exactly two partial cables 440-1, 440-2. In this embodiment, the partial cables 440 are welded to contact structures 660, wherein the contact structures 660 are press-fit contacts that are designed substantially L-shaped and are designed to be elastic on the side facing away from the weld locations, in order, for example, to be introduced into electrically conductive bores, via which the circuit board 260 is thus electrically connectable to the respective partial cables 440.

Moreover, FIG. 9 illustrates the presence of the curved sections 470, which are also disposed in the subsequent housings 400 and thus realize the strain relief. Here in the region of the first module 110-2 the partial cables 440 extend into the recesses 630 of the supply-line component 180.

In the first module 110-1 the supply-line component 180 includes the above-mentioned recesses 630. Here two groove-shaped recesses 630 have been incorporated into the external shape of the supply-line component 180, which is also referred to as the valve extension, wherein the partial cables 440 are guided. In this way it can be possible to avoid sharp edges in the region of the partial cable 440 and thus also avoid short circuits between these and the supply-line component 180.

Figure 10:
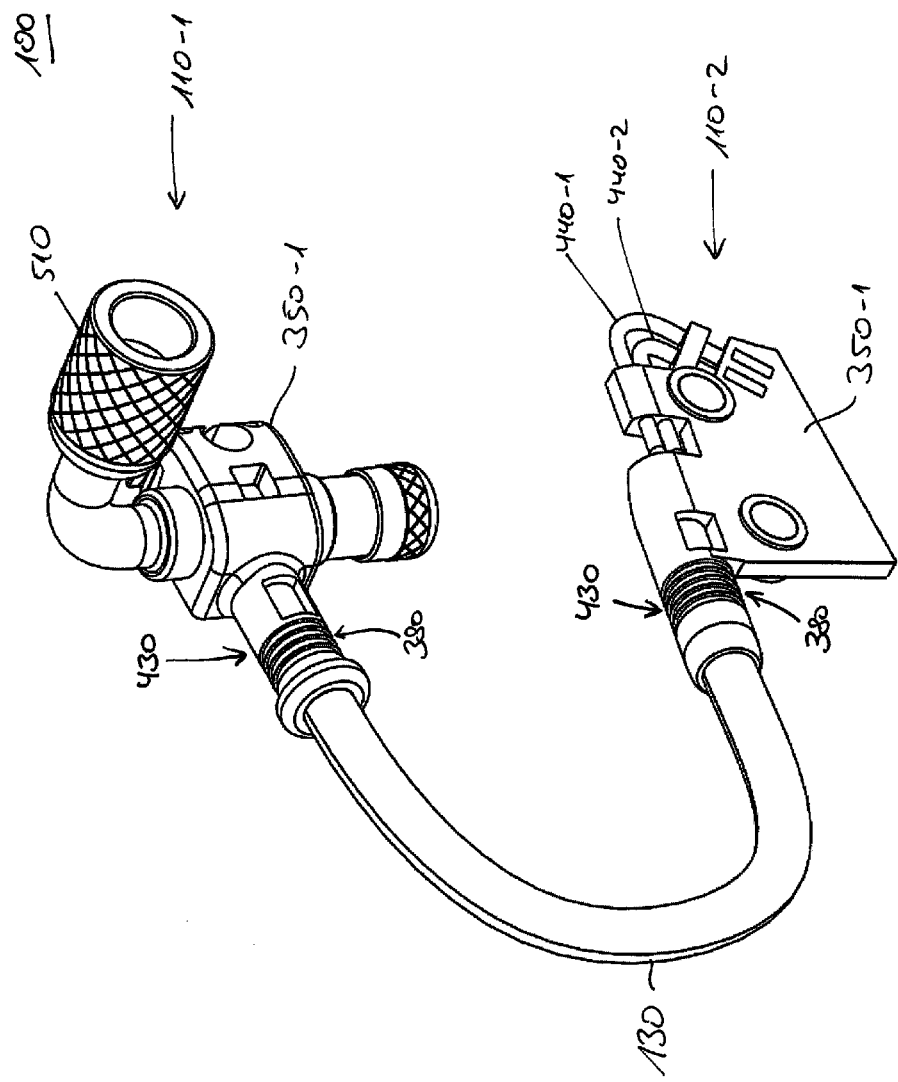
FIG. 10 shows a perspective depiction of the tire monitoring system according to an exemplary embodiment for a subsequent production process/step.

FIG. 9 thus shows the arrangement of the respective components in the context of a first production process/step, before the preform (premold), which forms the first partial housing 350-1, is formed. Here the flexible cable 130, the supply-line component 180 or the valve extension, and the spacer component 640, which is also referred to as the threaded insert, are inserted into the corresponding tools. After the first manufacturing process/step, wherein the preform or the first partial housing 350-1 of the two modules 110 is respectively formed, the situation depicted in FIG. 10 exists. Thus FIG. 10 shows a perspective depiction of the tire monitoring system 100 with the two modules 110. In the overmolded regions the cable 130 or its partial cables 440 have the above-described curved sections, which each extend around at least 90°. Using these curved regions a strain relief of the weld locations and of the contact structures 660 can be achieved so that these are not directly strained, even with a tension on the cable 130 during use.

As was already explained in the context of FIG. 5, the first partial housings 350 each include the sealing structure 380 in a cable feeding section 430. This sealing structure 380 is also referred to as a labyrinth design of the preform. Thus FIG. 10 not only illustrates the guiding and position of the cable 130 or its partial cables 440, but also the strain relief concept of the preform or of the first partial housing 350-1.

Figure 11:
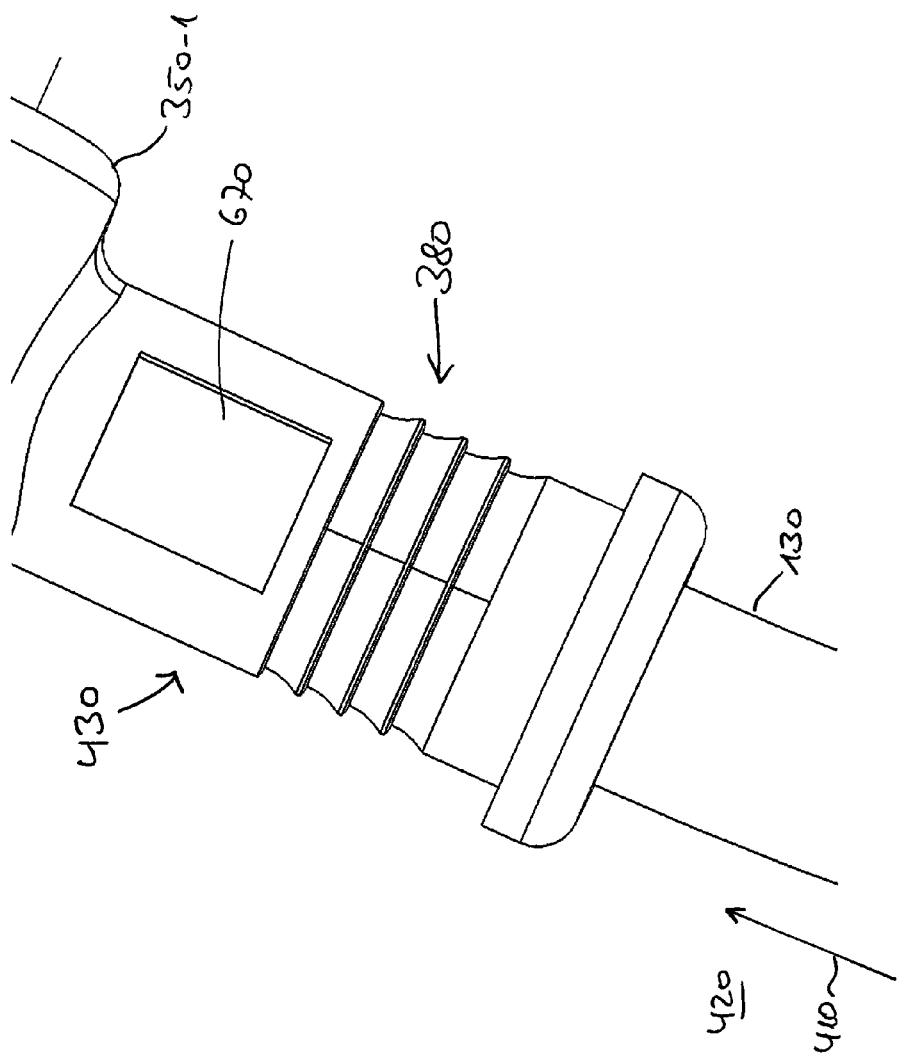
FIG. 11 shows a plan view of the sealing structure of the first partial housing of the first module of the tire monitoring system shown in FIGS. 7 to 10 according to an exemplary embodiment.

FIG. 11 shows an enlarged depiction of the sealing structure 380 in the region of the cable feeding section 430, through which the cable 130 is inserted into the first partial housing 350-1. Here the sealing structure 380 includes a plurality of elevations or depressions which are disposed one-behind-the other and, in the present design, are formed asymmetric. They have steeper flanks on the side facing the external space 420 than on the side facing away from the external space 420 or towards the subsequent recess 360. Along the direction 410 indicated in FIG. 11, which the cable 130 follows leading into the module 110-1, the sealing structure 380 thus includes a plurality of gently sloping recesses disposed one-behind-the-other and correspondingly an elevation steeply increasing against these. Moreover, FIG. 11 also illustrates the presence of an opening 670, which is provided, for example for easier guiding or stabilizing of the cable 130 in the tool during the forming of the first partial housing 350-1.

Figure 12:
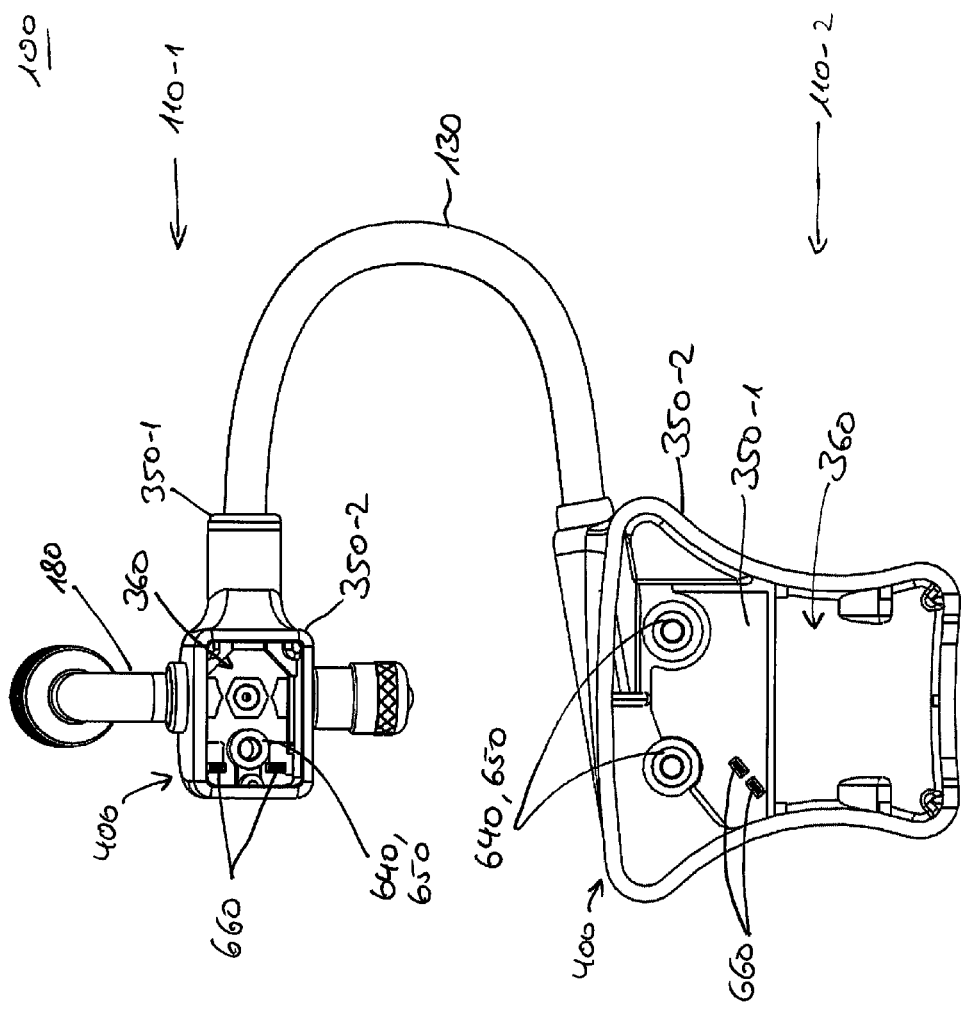
FIG. 12 shows a perspective depiction of the tire monitoring system after a further production process/step.

In a further production process/step, as can also be seen in the perspective depiction of FIG. 12, the tire monitoring system 100 with its two modules 110-1, 110-2 and the flexible cable 130 is at least partially overmolded again in order to thus form the second partial housing 350-2, which comprises the corresponding counter-sealing structure 390, which is in engagement with the sealing structure 380. As a result, the external shape of the respective modules 110 and thus of the sensor is thus at least partially achieved. Moreover, the individual components of the preforms (first partial housing 350-1) can thus be gripped.

Here FIG. 12 shows the situation where in the contact structures 660, i.e. the press-fit contacts to which ends of the partial cable 440 are welded and protrude a few millimeters into the recess 360, which the two partial housings 350-1, 350-2 form together, and via which the electrical contact to the circuit board 260 of the two modules 110-1, 110-2 is provided. In a subsequent process/step, the circuit board 260 is pressed onto the now-partially-manufactured housing 400, i.e. into the recesses 360 until the circuit board 260 enters into mechanical contact with the spacer components 640, which due to their design shown here are also referred to as threaded inserts, spacers, sockets, or sleeves. These spacer components 640 thus form a corresponding stop. During this pressing-in process/step, the contact structures 660 are also electrically connected to the circuit boards 260 by using a cold welding process. As shall be explained below, subsequently the circuit boards 620 are additionally attached and preloaded by screwing corresponding screw elements into the spacer components 640 and the housing, i.e., more specifically the recesses 360, encapsulated by the encapsulation masses 370. In principle any encapsulation mass 370 can be used here.

With regard to the materials of the first and second partial housings 350-1, 350-2, it can be advisable to use materials that have comparable thermal expansion coefficients, as was described above. Thus these materials can have a difference in thermal expansion coefficients that is at most 10% of the largest value of the respective thermal expansion coefficients. Ideally the difference can also be smaller, for example at most 5%, at most 2% or at most 1%. Thus the partial housings 350-1, 350-2 can be made, for example, substantially from the same material and thus have substantially identical thermal expansion coefficients. Polybutylene terephthalate (PBT), another suitable thermoplastic, or also another polymer can be used, for example, as the material for overmolding.

In a two-step process the supply-line component 180 has thus been consecutively overmolded and thus been integrated into the subsequent housing 400 of the first module 110-1. This housing sets the correct position of the discrete component 150, wherein it can be, for example, a pressure sensor based on SMD technology (SMD=surface-mount device=component attached to the surface) in relation to the opening 200 in the supply-line component 180. For this reason a circuit board 260, for example, can be utilized which can at least partially implement the design features explained below.

Figure 13:
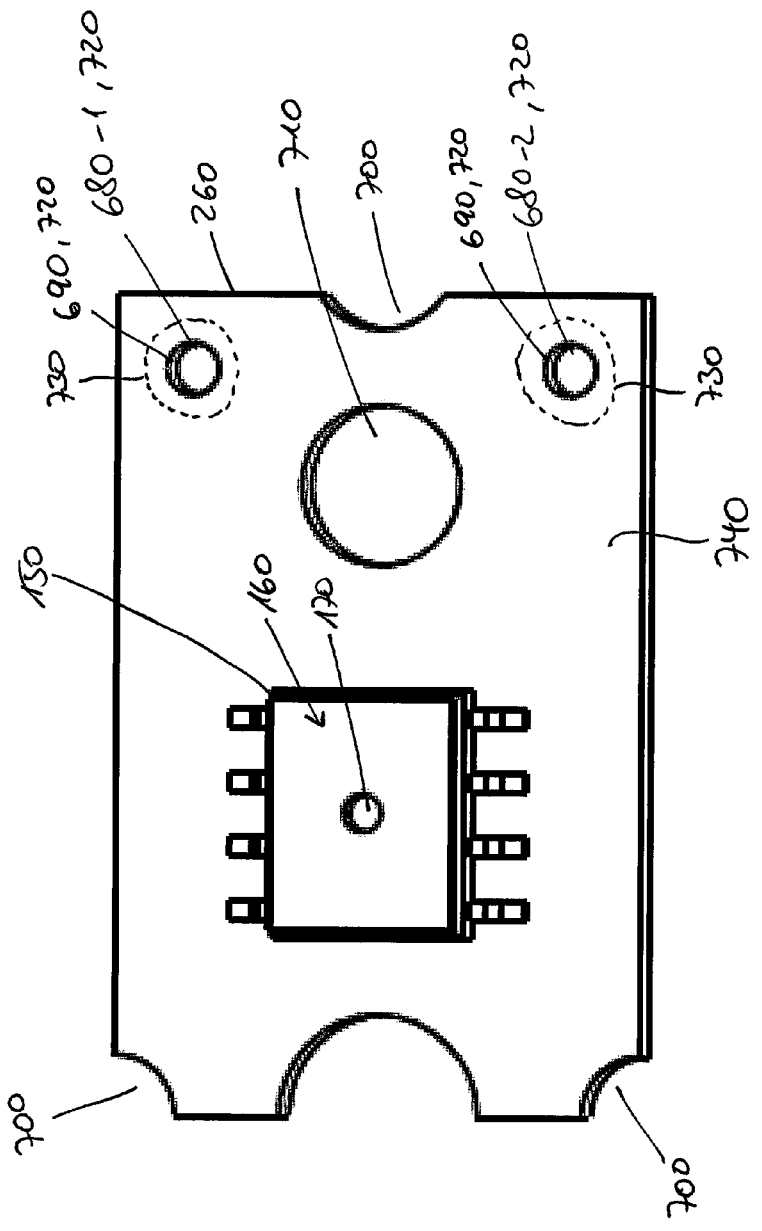
FIG. 13 shows a schematic perspective depiction of a circuit board including a discrete component.

FIG. 13 shows a simplified perspective view of a circuit board 260 for the first module 110-1. In a manner based on SMD technology a discrete component 150 is attached thereon which is configured to sense/detect/capture the physical value with respect to the tire. For this purpose the discrete component 150 includes the detection section/portion 170 on a surface 160, which can be formed, for example, by an opening in a housing of the discrete component 150. Thus the discrete component 150 can be embodied, for example, as an integrated circuit in the above-mentioned housing.

In other words, a pressure sensor manufactured using SMD technology as the discrete component 150, for example, including a central hole or central opening as the detection section/portion 170, is mounted on the circuit board 260 of the valve module 110-1. A representative design of such a circuit board 260, which is configured in accordance with the housing features of the housing 400 of the respective module 110-1, is depicted in FIG. 13.

In addition to the SMD technology already mentioned, the discrete component 150 can be mechanically indirectly or directly attached to and in electrical contact with the circuit board 260. In addition to SMD technology, other attachment and contact technologies, for example, discrete components based on so-called in-line technology can also be contacted, wherein the electrical and mechanical contact is realized via bores in the circuit board 260. Appropriate socketed solutions can also be used. Here the subsequent housing 400 can enclose both the circuit board 260 and the seal 210 which is also introducible by inserting the circuit board 260 into the module 110-1.

Furthermore, the circuit board 260 depicted in FIG. 13 includes two bores 680-1, 680-2, which are precisely so disposed and configured as to make possible an electrical contact via the contact structures 660, i.e. the press-fit contact. For this purpose an inner surface 690 of the bores can be metalized in order to thus make possible the electrical contact of the contact structures 660 to the further components of the circuit 270 of the circuit board 260. Here the discrete component 170 is a part of the circuit 270. Moreover, the circuit board 260 includes a plurality of guide cutouts 700, which, for example, are also producible as bores and serve to guide the circuit board 260 into the interior of the recess 360 of the housing 400 before the closing with the encapsulation mass 370. Furthermore, the circuit board 260 comprises a bore 710 for the screw elements of the subsequent preloading structure 650.

With a view to increasing the operational reliability or the robustness of the module 110 with respect to the ingress of moisture or dust, the circuit board 260 can also be configured such that around the contact terminals 720, which the bores 680 or the electrically conductively coated inner surfaces 690 themselves form, it has no electrically conductive structures in the corresponding areas at least on the surface of the circuit board 260 that are directly connected in an electrically conductive manner to the contact terminals 720. Thus even if moisture or other impurities reach the interior of the housing 400 of the respective module 110 by traveling along the cable 130 and along the partial cable 440, an electrical short circuit can thus possibly be prevented or at least made less likely.

Such a module 110, which can be both the first module 110-1 and the second module 110-2, can thus further comprise a cable that comprises at least one partial cable provided for guiding a signal, which cable is indirectly or directly electrically connected to the circuit board 260 at a contact terminal 720 of the circuit board 260 on a surface thereof. In such a case, in an area 730 on the surface of the circuit board 260, which area 730 is around the contact terminal 720, the circuit board 260 includes no electrically conductive structures that are not directly electrically connected to the contact terminal 720. A structure that is directly connected to the contact location can be such a structure, for example, that substantially does not cause a voltage drop along the structure even in the case of a current flow within the specified parameters of the respective module. In other words, in comparison to other components such a structure has a small electrical resistance of, for example, at most 20%, at most 10%, at most 5%, or at most 2% of the total resistance of the component with regard to a current flow to a reference potential, i.e., for example, ground. It can thus be, for example, a supply line structure for a current or a voltage, i.e., for example, a via or another supply line such as a conductor/circuit path.

Depending on the specific implementation, the area 730 around the contact terminal 720 can extend on a main surface 740 of the circuit board 260, for example, at least 1 mm in all directions beyond the contact terminal 720. In other exemplary embodiments this can also be at least 2 mm, at least 3 mm, at least 4 mm, at least 5 mm, or at least 6 mm.

In order to further reduce the risk of short circuits, the circuit board 260 can include no electrically conductive structures, not directly connected to the contact terminal 720, on the surface of the circuit board in the area 730 of the contact location of the circuit board 260. In addition, the entire circuit board can also include no electrically conductive structures electrically connected to the contact terminal 720.

In this embodiment, the circuit board 260 is substantially a plate-like structure, which has extensions along a first direction and along a second direction that is perpendicular to the first direction, which extensions are substantially larger than an extension along a third direction which is perpendicular to both the first direction and the second direction. This third direction is also referred to as the thickness of the circuit board 260 and can correspond, for example, to at least a fifth, at least a tenth, or at least a twentieth of a largest extension along the first or second direction. Here the main surface 740 is the surface that extends parallel to the first and second directions.

In the exemplary embodiment shown, the circuit board 260 thus includes three guide recesses 700 for vertical positioning of the circuit board 260 in the recess 360 of the housing 400. Using the above-described spacer components 640 or threaded inserts, the circuit board 260 and the discrete component 150 can be horizontally positioned. Using the contact structures 660, i.e. for example the press-fit contacts, electrical connections of the partial cable 440 and optionally also a mechanical stabilization can be achievable.

Figure 14:
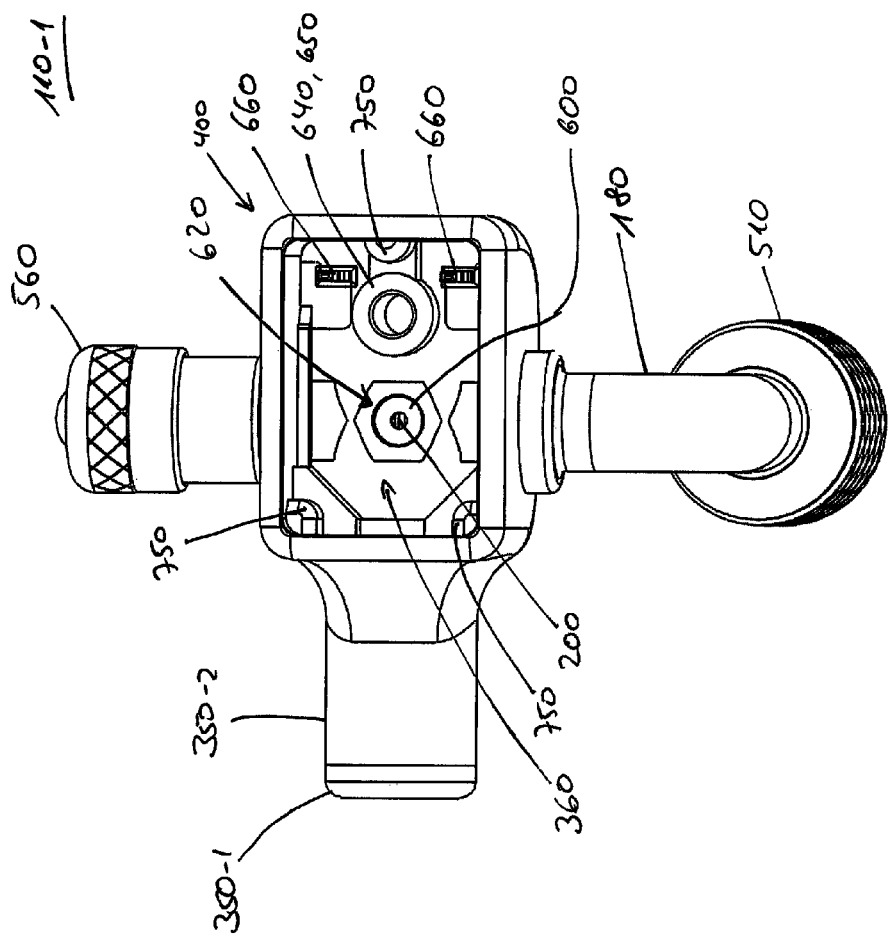
FIG. 14 shows a perspective depiction of the first module before the insertion of the circuit board.

FIG. 14 shows a perspective depiction of the first module 110-1 before the inserting of the circuit board 260. For simplification of illustration the cable 130 is not depicted. FIG. 14 thus shows a view into the recess 360 which is formed by the first and second partial housings 350-1, 350-2 of the housing 400. Here the second partial housing 350-2 forms guide structures 750 which interact (cooperate) with the guide recess 700 shown in FIG. 13 such that the above-described vertical guiding of the circuit board 260 is made possible or ensured by these.

FIG. 14 also shows the spacer component 640 of the preloading structure 650 and the seal seat 600 around the bore 200, which leads to the channel (not shown in FIG. 14) of the supply-line component 180. Moreover, the contact structures 660 configured as press-fit contacts are in turn visible in FIG. 14. FIG. 14 thus shows the valve module (first module 110-1) and its housing 400 without the hardware described in connection with FIG. 13 or the seal 210.

Before the circuit board 260 is inserted, the seal 210 is first inlaid in the seal seat 600. This is illustrated in the perspective depiction in FIG. 15.

Figure 15:
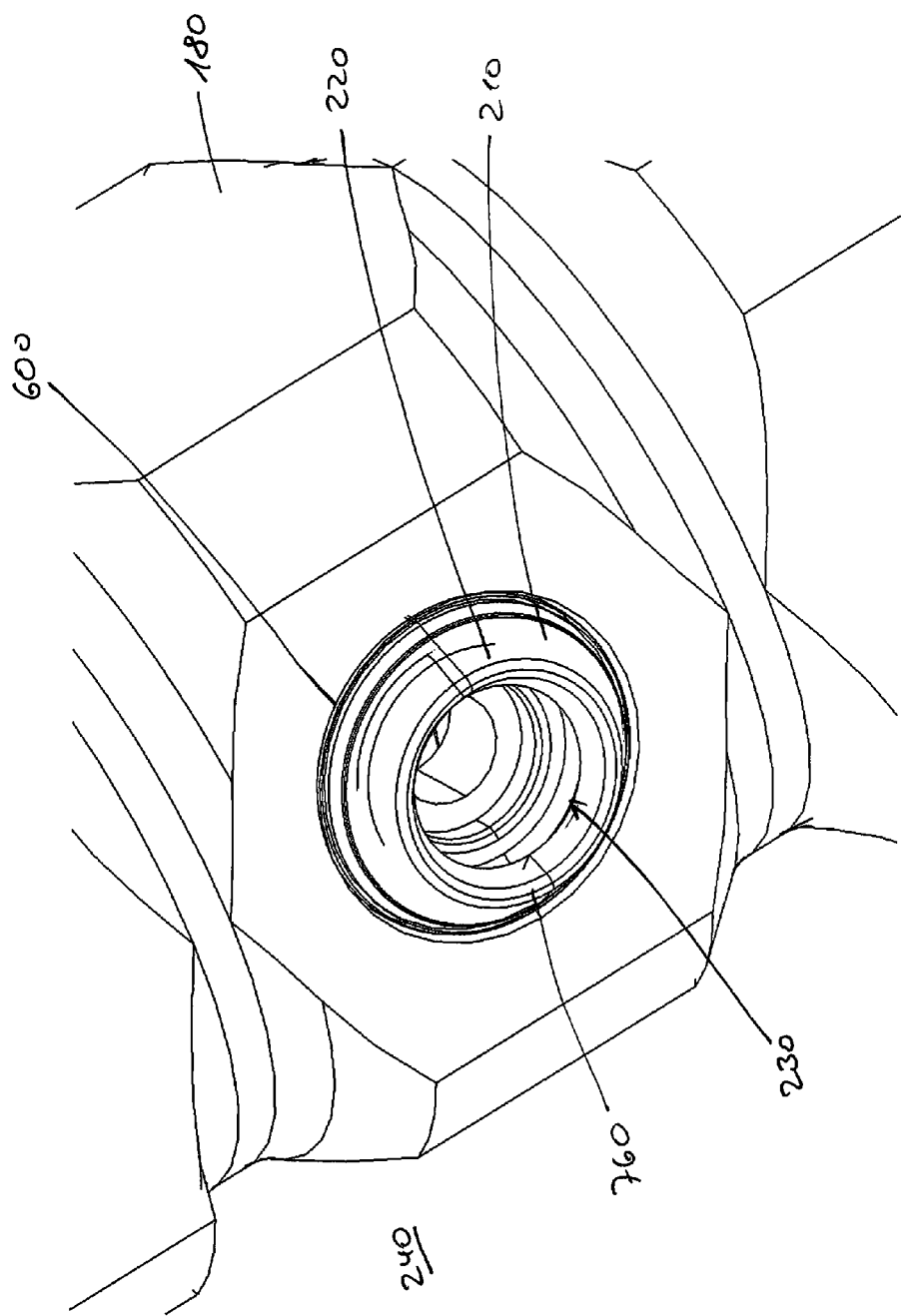
FIG. 15 shows a perspective depiction of the supply-line component including the seal.

FIG. 15 thus shows a perspective depiction of the supply-line component 180 including the seal seat 600, wherein the seal 210 is installed. Here the seal 210 includes a seal lip 220, which is configured to close the detection section/portion 170 (not shown in FIG. 15) so that the seal forms a sealing chamber 230, which comprises the detection section/portion 170 and is separated from an external space 240 by the seal 210.

In this embodiment, the seal lip 220 has a seal edge 760, which is configured to be in contact with the surface 160 of the discrete component 150. Starting from the seal edge 760, the seal lip has an outer edge with a cross-section, which, starting from an unloaded state of the seal 210, becomes larger if the seal is configured for a pressure of the gaseous medium that is greater than the pressure in the external space. In contrast, if the seal 210 is configured for a pressure of the gaseous medium that is less than the pressure in the external space, then starting from the seal edge 760 the seal lip can have an outer edge with the cross section which becomes smaller starting from an unloaded state of the seal 210. Depending on which pressure conditions are present, in this way an additional sealing effect can be achieved due to the prevailing pressure conditions, since the seal is additionally compressed due to the pressure acting thereon.

The seal 210 thus differs in very significant ways from conventional seals, for example, an O-ring seal. A seal 210, such as is used here, can thus make possible, for example, a greater tolerance compensation and thus optionally make possible a reduction of the preload or the mechanical stress on the supply lines of the pressure sensor (discrete component 150). In other words, the forces exerted by the seal lip 220 on the electrical supply lines of the discrete component 150 can thus be reduced. In contrast, for example, to an O-ring seal, an improvement of the compromise with respect to a reduction of the occurring forces and an increase of the tolerance range can be achievable using an undercut or an undercutting of the seal lip 220. Thus, for example, a greater compensation range or tolerance range can be achievable by a seal lip 220 disposed at an angle different from 90°. Depending on the specific implementation, it can be advisable here to provide a preload that is associated with the geometry of the seal lip 220 in a substantially unloaded state and/or with a deformation of the seal lip 220. In this way the seal lip 220 can be, for example, in contact with this discrete component 150. This can take place such that the seal lip 220 moves farther outward or inward with increasing or decreasing (air-) pressure and thus engages perpendicular to the surface of the discrete component 150. Thus, for example, a greater seal gap than could result from tolerances can be compensated without a large preload due to the geometric design. The use of a, for example, V-shaped seal lip 220 can thus optionally reduce the mechanical stress on the actual sensor.

However, it can also be possible that the seal lip 220 has a seal gap with respect to the discrete component 150 in a pressureless or unstressed state with respect to the discrete component 150, i.e., for example, can be installed without a preload in this state.

Figure 16:
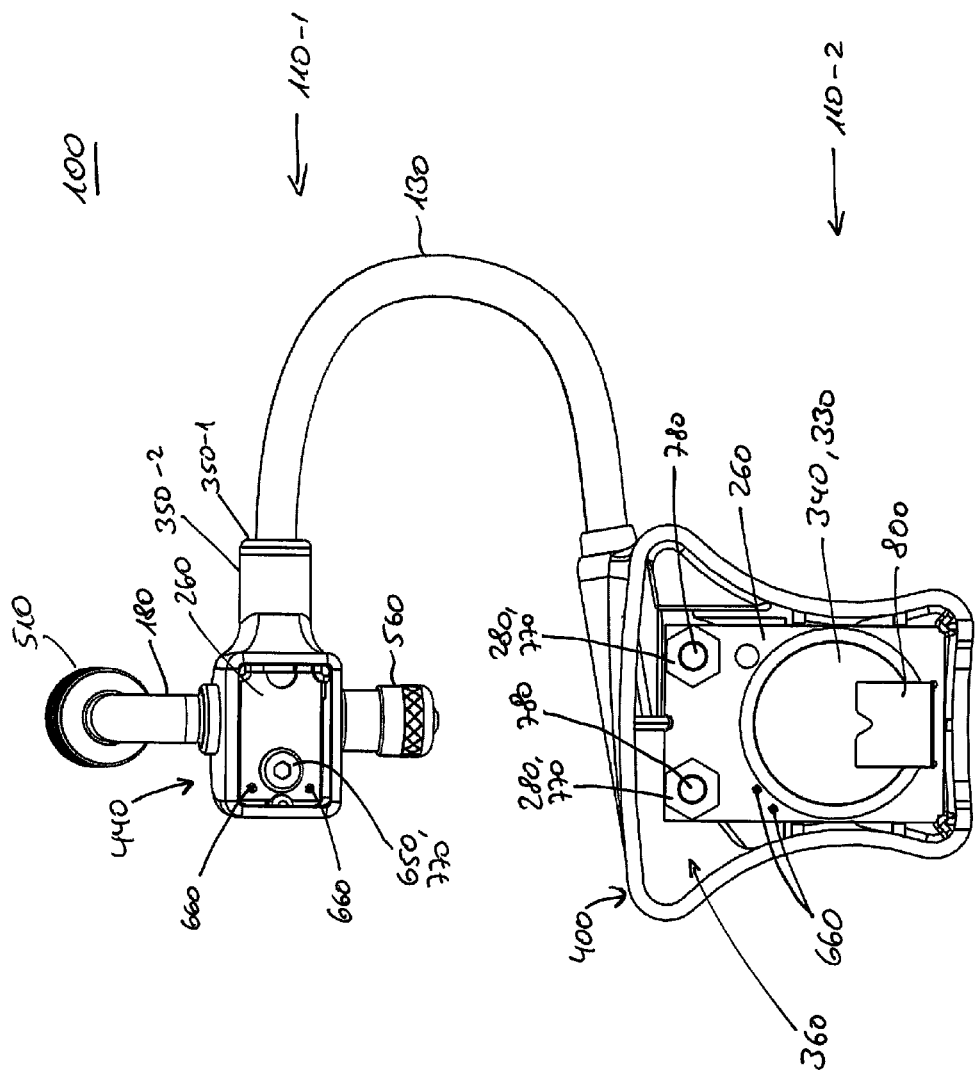
FIG. 16 shows a perspective depiction of the tire monitoring system after a further manufacturing process/step.

FIG. 16 shows a perspective depiction of the tire monitoring system 100 including the first module 110-1 and the second module 110-2 after a further manufacturing process/step. In this manufacturing process/step, the seal 210 has been inserted in the seal seat 660 of the supply-line component 180, and the circuit board 260 of the two modules 110-1, 110-2 has been inserted into the corresponding recess 360.

FIG. 16 shows that the preloading structure 650 comprises the above mentioned screw elements 770, using which and using the thread in the spacer component 640 (not shown in FIG. 16) the circuit board 260 is pressed against the spacer component 640 and thus the seal 210 (also not shown in FIG. 16) is pressed. In this way a preload can be applied to the seal, which is in direct contact with the surface 160 of the discrete component 150.

Also with regard to the second module 110-2, the circuit board 260 is pressed against the respective spacer components 640 using corresponding screw elements; however, the spacer components 640 are not depicted in the illustration in FIG. 16. The spacer components 640 here also include a flat surface that is pressed against the circuit board 260 using the screw elements 770. Here the spacer components include an internal thread into which a corresponding external thread of the screw elements 770 engages. The screw elements 770 can include, for example, a further surface or stop surface, against which the circuit board 260 is pressed on a side facing away from the spacer component 640. The screw elements 770 can thus each include, for example, an non-threaded cylindrical section, which extends through the corresponding bores of the circuit board 260 and is disposed between the external thread and the stop surface against which the circuit board is pressed by the tightening of the screw elements 770. An external hexagon connects—possibly behind an optional transition region—to the side of the stop surface facing away from the external thread, which external hexagon can serve, for example, for installing the screw elements 770. Of course the screw elements can also be configured differently, for example, in the form of simple screws or other designs.

Moreover, the screw elements can serve as or as part of the spacer 280. For this reason the screw elements 770 shown in FIG. 16 include a bore 780 have an internal thread into which a screw, for example, for attaching the module 110-2 to the attachment component 250, is insertable. The spacer 280 thus includes a support surface on which the circuit board 260 rests in the installed state. It further comprises the screw element 770, which fixes the circuit board 260 on a side facing away from the support surface.

With regard to the second module 110-2, each of the spacer components 640 (not shown in FIG. 16) can also include, for example, an external thread, which extends through corresponding bores in the circuit board 260. Using these external threads at least one spacer 280, which has, for example, a hexagonal external contour, can be mechanically connected to the circuit board 260 so that this spacer 280, as was already explained in the context of FIG. 4, can transmit mechanical vibrations from an attachment component 250 to the circuit board 260. The spacer 280 can be mechanically connected, for example, screwed, to the attachment component not shown in FIG. 16. In order to make an ingress of contaminants, such as water, more difficult also via this connection of the circuit board 260 to the environment, the at least one spacer can be enclosed, for example, by an encapsulation mass, which, however, is not shown in FIG. 16. In this way a material contact can be established that at least reduces the described penetration even if it cannot be completely prevented. In order, for example, to also reduce the chance of a formation of a short circuit due to such contaminants as water, an appropriate attachment structure for the installation of the spacer 280, for example an appropriate bore and surrounding area can also be provided as has been described in connection with FIG. 13 and the area 730 shown there.

In addition, the illustration in FIG. 16 shows that the second module 110-2 includes an energy source (power supply) 340. This can be, for example, an electrochemical energy source, i.e., for example, a battery and/or an accumulator. The energy source 340 can also be a component 330 that was already explained above in connection with FIG. 4. More specifically the energy source 340 as shown in FIG. 16 is a button cell, which supplies, via an electrically conductive holder 800, both the circuit board 260 and its circuit of the second module 110-2 with electrical energy (current), and supplies, via the cable 130, the circuit board 260 and its circuit of the module 110-1 with electrical energy (current). In other words, in a tire monitoring system 100 such as is depicted in FIG. 16, the first module 110-1 is at least partially supplied with electrical energy (current) from the energy source 340 of the second module 110-2 via the flexible cable 130.

As has already been mentioned multiple times, in the exemplary embodiment shown here the flexible cable 130 includes exactly two partial cables 440, which are also referred to as lines. The first module 110-1 and the second module 110-2 are electrically connected to each other via these partial cables 440. In this way not only can the cabling costs be reduced, but a smaller and thus possibly mechanically stressable cable 130 can also optionally be brought into use.

Due to the fact that the flexible cable 130 only includes the two partial cables 440, or in other exemplary embodiments possibly also only comprises one partial cable 440, the first module 110-1 can be fluidly connectable to the tire interior, which is fillable or filled with the fluid (e.g., gas); however, the first module 110-1 and the second module 110-2 are typically embodied fluidly isolated from each other. In other words, in such a case no exchange of the fluid, i.e., for example, the gas or gas mixture from the interior of the tire, can occur from the first module 110-1 to the second module 110-2 via the flexible cable 130. Stated differently, the second module 110-2 can be fluidly isolated from the interior of the tire.

FIG. 16 thus shows a perspective depiction of the tire monitoring system or tire pressure monitoring system and its housing including the installed hardware.

Figure 17:
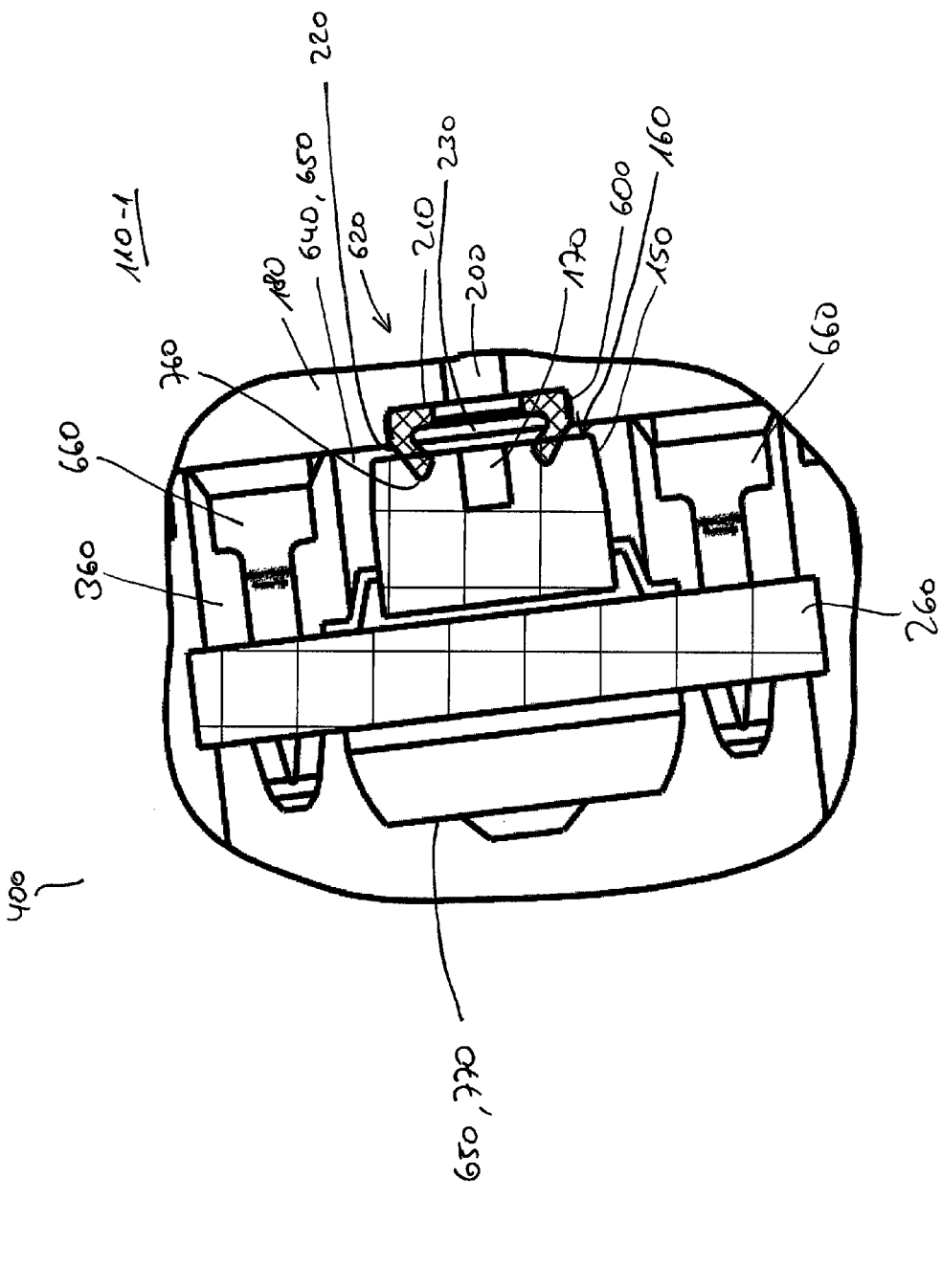
FIG. 17 shows a schematic cross-sectional depiction through the assembled first module.

FIG. 17 shows a schematic cross-sectional depiction through the module 110-1 in an installed state. Thus FIG. 17 shows the supply-line section 620 of the supply-line component 180 including the opening 200, which fluidly connects the channel 190, not shown in FIG. 17, to the detection section/portion 170 of the discrete component 150. As has already been explained, the discrete component 150 is electrically and mechanically connected to the circuit board 260, wherein the electrical circuit board is electrically connected to the partial cables 440 not shown in FIG. 17 via the contact structures 660 embodied as press-fit contacts. In addition, FIG. 17 shows the spacer 640 of the preloading structure 650, as well as the associated screw element 770, which engage in a corresponding thread of each spacer component 640 or are in or can be brought into engagement with the spacers in another manner.

In addition, FIG. 17 shows the seal seat 600, which is formed in the region of the supply-line section 620 and in which the seal 210 is received. Here, however, the seal 210 is depicted in a relaxed state, wherein the seal edge 760 is only just not in contact with the surface 160 of the discrete component 150. Rather, during installation the seal lip 220 is deformed such that in contrast to the depiction of FIG. 17 it is in contact with the surface 160 of the discrete component 150, i.e., is pressed by the preloading structure 650 against the supply-line component 180. Thus the sealing chamber 230 is formed radially inwardly with respect to the seal lip 220 relative to the axis of symmetry of the seal 210, which substantially coincides with the bore axis of the opening 200 or of the axis of symmetry of the seal seat 600.

FIG. 17 thus shows the interface between the hardware, i.e. the electronic components of the module 110-1, and the mechanical components of the module 110-1.

In this embodiment, a specially shaped seal 210 having a flexible seal lip 220 effects the sealing of the interface between the supply-line component 180, which is also referred to as the valve extension, and the discrete component 150 (SMD pressure sensor). Here the seal can compensate for tolerances in the complete system.

Due to the above-described design of the external shape of the cross-section start from the seal edge 760 in the unstressed state of the seal 210, with an increase of the air pressure, for example, following an installation of the module 110 on a tire, the flexible seal lip 220 can move outward and, in the example of a low axial preload, strengthen and enlarge the contact region between the discrete component 150 and its surface 160 and the seal 210.

The axial preload of the seal 210 can be determined by the spacing between the surface 160 of the discrete component 150 and the base of the sealing space 230. During the assembly process the circuit board is pressed into the housing 400 until the circuit board 260 is in contact with the spacer component 640, i.e. the threaded insert of the housing 400. As a result, a nominal seal preload can thus be defined by the housing 400 or its geometry. More specifically, the preload here defines a distance between the sealing chamber base and the contact region of the spacer component 640. Further influencing factors are the height of the discrete component 150 and the design of the seal 210.

In addition to the discrete component 150, using the screw elements the circuit board 260 is also attached such that thermal and mechanical influences relating to the seal can be reduced or possibly even minimized. As shall be described below, an appropriate encapsulation mass, for example a polyurethane encapsulation mass utilized in the electronics industry (PU=polyurethane), can be used to achieve an additional sealing and to seal the hardware, i.e. the electronic components, with respect to the environment. The encapsulation mass 370 can thus be used to seal the recess 360 in which the circuit board 260 is disposed.

Figure 18:
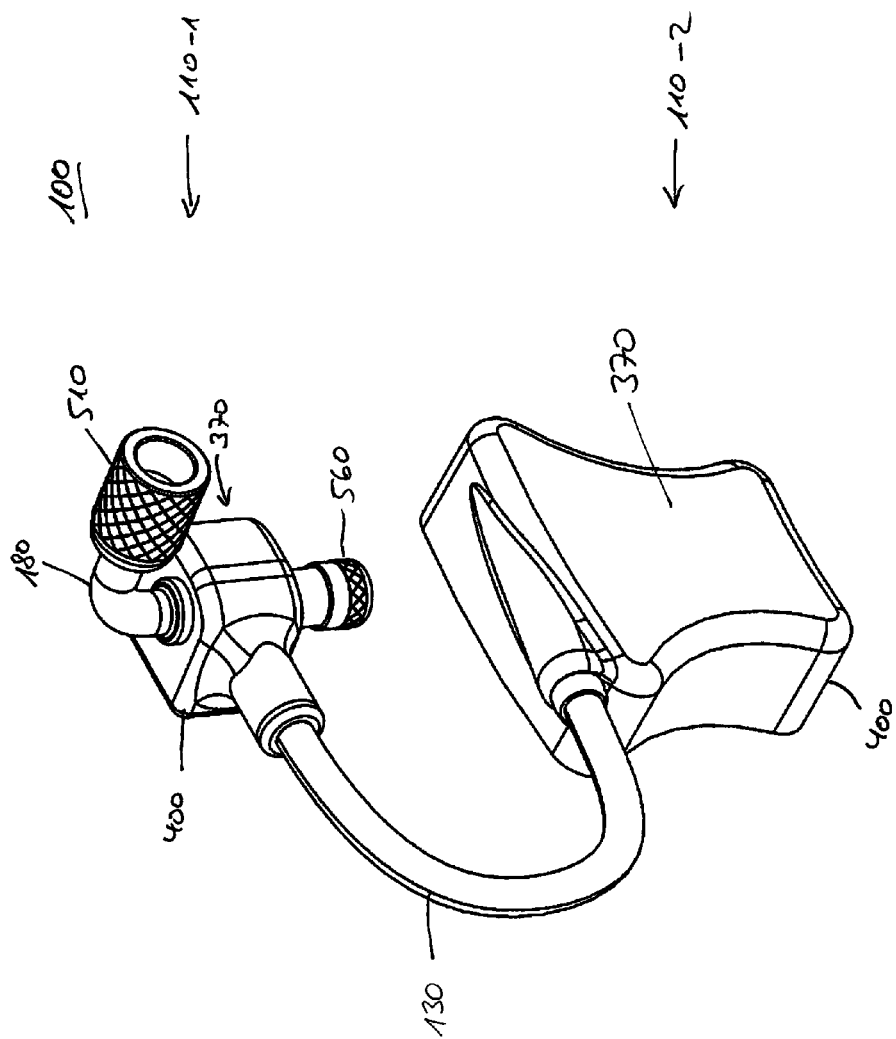
FIG. 18 shows a perspective depiction of the tire monitoring system after a further process step.

FIG. 18 shows a perspective depiction of the tire monitoring system 100 after a further process step, during which the recess 360 is sealed by the encapsulation mass. However, due to the perspective shown the recess 360 in the module 110 is not visible. FIG. 18 thus shows the tire monitoring system 100 after a further overmolding process of the cable 130 and the sealing of the recess 360 (no longer shown in FIG. 18) by the encapsulation masses 370 (not shown in FIG. 18) of the two modules 110-1, 110-2.

The housings 400, as depicted in FIG. 18, are not formed one-piece, but are produced as one part. A "one-piece component" is understood to mean a component that is manufactured from exactly one continuous piece of material without any seams in it. A "component or structure provided or manufactured one-part" or a "component or structure provided or manufactured integrally with at least one further component or structure" is understood to mean one which cannot be separated from the at least one further component without destroying or damaging one of the at least two participating components. A one-piece component thus also represents at least one component integrally manufactured or one-part with another structure of the respective component.

Other housings 400 can of course optionally be embodied one-piece.

Figure 19:
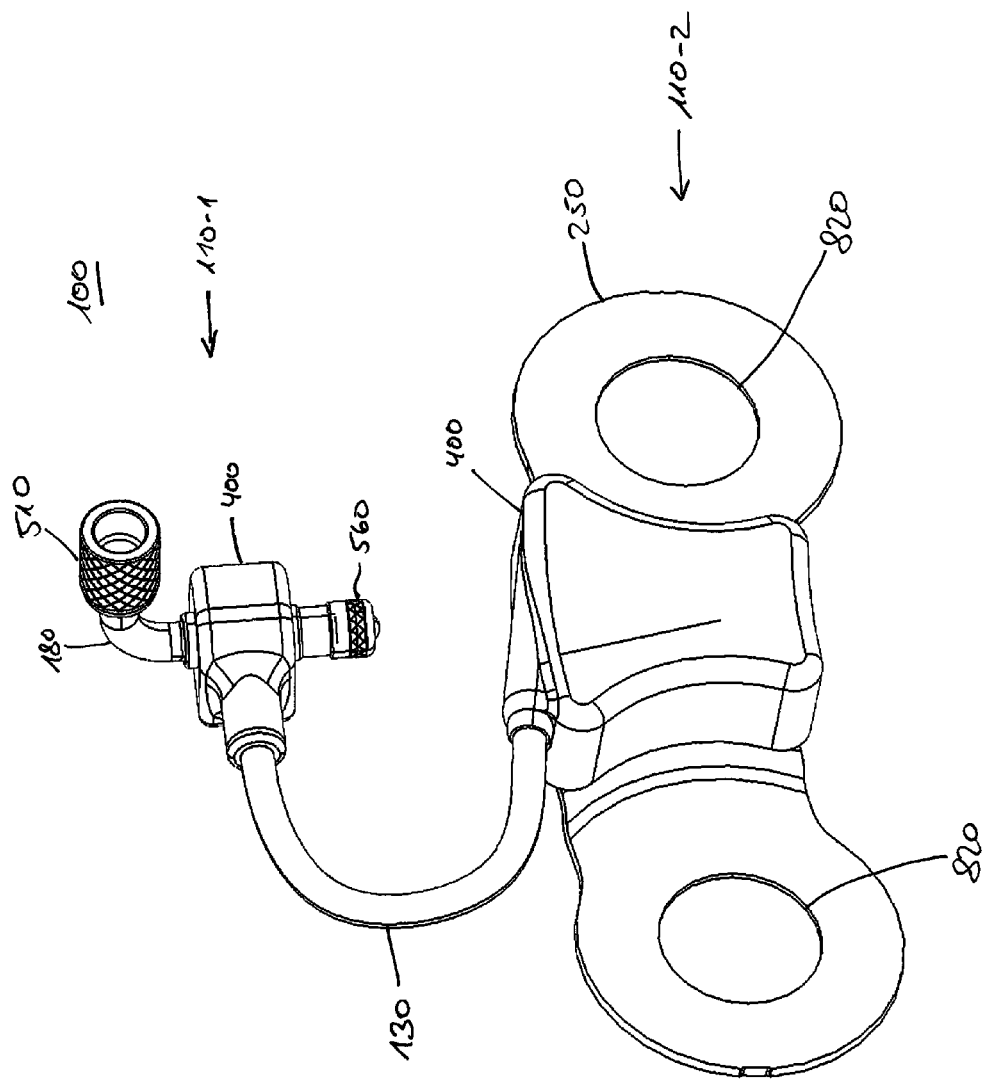
FIG. 19 shows a perspective depiction of the tire monitoring system after a further manufacturing process step.

FIG. 19 shows a perspective depiction of the tire monitoring system 100 after, in the second module 110-2, the attachment component 250 has been connected to the housing 400 of the second module 110-2. FIG. 20 shows a perspective depiction corresponding to FIG. 19, wherein, however, the tire monitoring system 100 is shown from a back side in comparison to the depiction in FIG. 19. As was already explained above, here the attachment component 250 is designed plate-shaped and is screwed onto the housing 400 of the second module 110-2 using at least one screw, more specifically in the exemplary embodiment shown here using two screws 810 via the spacer no longer visible in FIGS. 19 and 20. In other words, in the module 110-2 described here, the at least one spacer 280 is screwed to the attachment component.

In order to mechanically connect the attachment component 250 to the wheel rim, for example, using the wheel bolts, which are also used for fixing the wheel rim, the attachment component 250 includes two bores 820 which are precisely so designed that the corresponding wheel bolts pass through them. Therefore, by using appropriate nuts the second module 110-2 can be mechanically connected or mechanically coupled to the wheel rim using two adjacently disposed bolts, for example of the wheel support, to the rim via corresponding nuts.

Thus in a tire monitoring system 100, such as is shown, for example, in FIGS. 19 and 20, the second module 110-2 can be attachable to a wheel rim, wherein the wheel rim together with the tire at least partially forms a wheel of a vehicle.

Thus in the tire monitoring system 100 thus implemented, different design features for protecting the hardware against moisture, water, and similar environmental-influences and -conditions can be implemented. Thus, for example, long overmolding distances of the cable sheaths, i.e. of the cable feeding section 430, a corresponding flexible cable 130, and an overmolding of the protruding contact structures 660 for prevention of corrosion of the components of the circuit board 260 near the contact structures 660 can be implemented. Likewise, the sealing structures and counter-sealing structures 380, 390 can be implemented in the labyrinth design shown, in the context of the preform (first partial housing 350-1), and correspondingly in the second partial housing 350-2 in order to prevent an ingress of water between the two partial housings 350-1, 350-2, i.e. the preform and the final injection-molded assembly. In addition, using the encapsulation mass 370, the circuit board 260 can be attached to the housing 400 with only a small number of contact points, for example via the spacer components 640 (threaded inserts), screws, and the contact structures 660 formed as press-fit contacts.

Figures 21A, 21B, 21C:
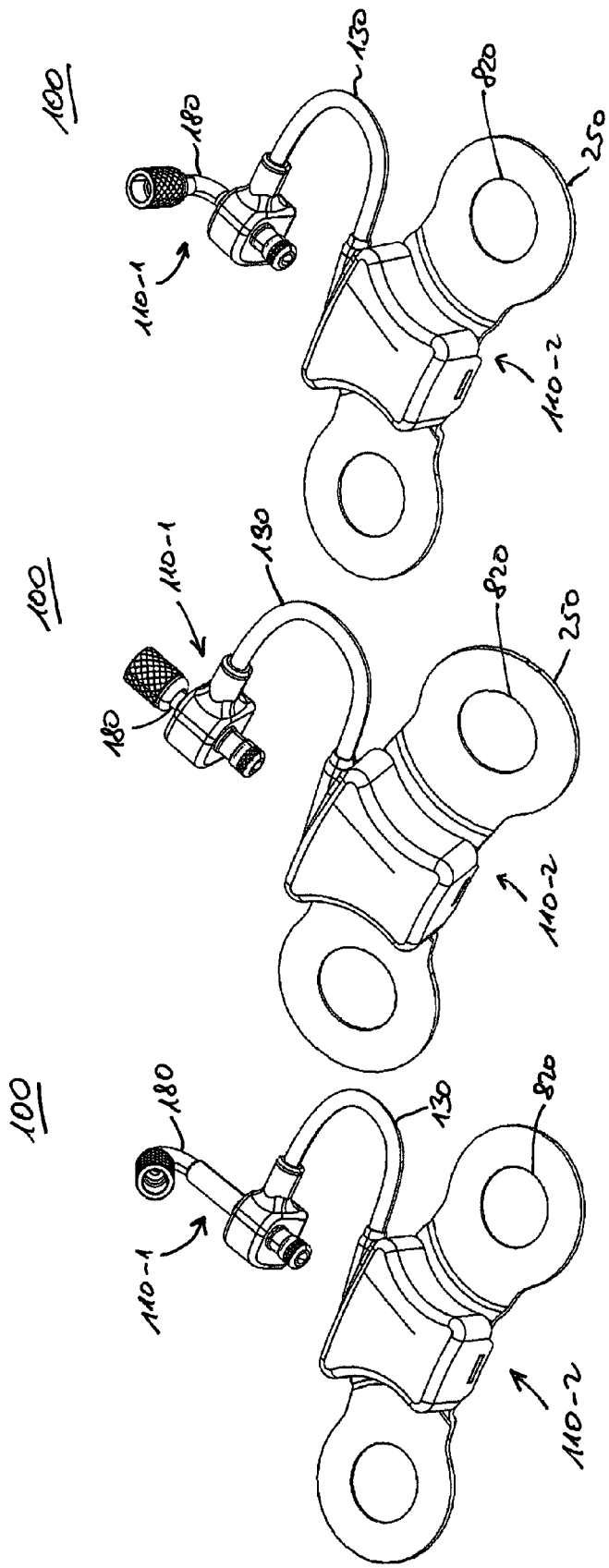
FIGS. 21a, 21b, and 21c show perspective depictions of different tire monitoring systems.

FIGS. 21a, 21b, and 21c show perspective depictions of tire monitoring systems 100, wherein, for example, different lengths of the flexible cable 130 are implemented. In addition, the supply-line components 180 can differ from one another with respect to their geometric design. Likewise, the bores 820 of the attachment components 250 can be designed differently with respect to their diameter and arrangement, for example, their distances from on another, in order to be able to cover different types of wheel rims of trucks and other vehicles. The version or embodiment depicted in FIG. 21c substantially corresponds to the above-described version of a tire monitoring system 100. FIGS. 21a and 21b show further exemplary embodiments of a tire monitoring system 100. Of course, in addition to the obvious changes, other, more substantially changes can be implemented in different tire monitoring systems 100. Thus, for example, different sealing concepts, different physical sizes or other parameters, which are not obvious at first glance, can be implemented. Thus in different exemplary embodiments the second module 110-2 can optionally be formed one-piece in order to detect/sense/capture the mechanical vibrational behavior of the wheel rim or of the associated wheel, while in other tire monitoring systems 100 the respective module 100-2 is not configured/designed to do this.

However, as the discussion above has shown, the sensor design presented here and the tools used for this purpose make possible a modification of the respective tire monitoring systems 100 with respect to cable lengths and other mechanically oriented parameters without greater effort or additional tool costs being necessary here. The system described can thus be used economically to provide different tire monitoring systems 100 according to an exemplary embodiment, using which different tire types can be manufactured. FIGS. 21a, 21b, and 21c thus illustrate some possible variants of a tire monitoring system 100.

Using a module 110 for detecting/sensing/capturing the vibrational behavior of a mechanical component it can be possible to improve a compromise with respect to an easy integratability, an easy manufacturability, robustness, reliability, and precision of the sensing of the vibration behavior. By using a tire monitoring system and/or a method for monitoring a tire it can be possible to improve a compromise with respect to integration, manufacturability, robustness, and precision of the monitoring of a tire. By using a module for sensing a physical value of a gaseous medium, it can be possible to improve a compromise with respect to an easy integratability, an easy manufacturability, a robustness, a reliability, and a precision of a module for sensing a physical value. It can also be possible to provide a module which makes possible an improvement of a compromise with respect to an easy integratability, an easy manufacturability, a durability or robustness, a reliability, and a precision of a circuit implemented in the module 110.

Although some aspects of the present invention have been described in the context of a device, it is to be understood that these aspects also represent a description of a corresponding method, so that a block or a component of a device is also understood as a corresponding method step or as a feature of a method step. In an analogous manner, aspects which have been described in the context of or as a method step also represent a description of a corresponding block or detail or feature of a corresponding device.

An exemplary embodiment can thus comprise a computer program including a program code for performing a method according to an exemplary embodiment when the program runs on a programmable hardware component. The individual method steps can be achieved here by controlling corresponding actuators, a reading of storage locations or other data sources, numerical and other manipulations of data, and other processes. In the context of such a program, however also in the context of other implementations of a method according to an exemplary embodiment, the individual processes can thus comprise a generating, providing, and optionally receiving of control signals, sensor signals, and other signals. The sending can also comprise a writing or storing of a value in a storage location or a register. Accordingly a reading or a receiving can also comprise a corresponding reading of a register or of a storage location. These signals can be transmitted, for example, as electrical, optical, or radio signals and formed continuously or discrete from one another independent of their signal values and their temporal arrangement. The corresponding signals can thus comprise, for example, analog signals, however also digital signals.

Depending on certain implementation requirements, exemplary embodiments of the invention may be implemented in hardware or in software. The implementation can be performed using a digital storage medium, for example a floppy disk, a DVD, a Blu-Ray disc, a CD, a ROM, a PROM, an EPROM, an EEPROM or a flash memory, a hard drive or another magnetic or optical storage device, on which electronically readable control signals are stored, which interact or can interact with a programmable hardware component such that the respective method is performed.

A programmable hardware component can be formed by a processor, a computer processor (CPU=central processing unit), a graphics processor (GPU=graphics processing unit), a computer, a computer system, an application-specific integrated circuit (ASIC), an integrated circuit (IC), a system-on-a-chip (SOC), a programmable logic element, or a field programmable gate array (FPGA) including a microprocessor.

The digital storage medium can therefore be machine- or computer readable. Some exemplary embodiments thus comprise a data carrier which includes electronically-readable control signals which are capable of interacting with a programmable computer system or a programmable hardware component such that one of the methods described herein is carried out. An exemplary embodiment is thus a data carrier (or a digital storage medium or a computer-readable medium) on which the program for performing one of the methods described herein is recorded.

In general, exemplary embodiments of the present invention are implemented as a program, firmware, computer program, or computer program product including a program, or as data, wherein the program code or the data is operative to perform one of the methods if the program runs on a processor or a programmable hardware component. The program code or the data can for example also be stored on a machine-readable carrier or data carrier. The program code or the data can be, among other things, source code, machine code, bytecode or another intermediate code.

A further exemplary embodiment is a data stream, a signal sequence, or a sequence of signals which represents the program for performing one of the methods described herein. The data stream, the signal sequence, or the sequence of signals can for example be configured to be transferred via a data communications connection, for example via the Internet or another network. Exemplary embodiments are thus also signal sequences which represent data, which are intended for transmission via a network or a data communications connection, wherein the data represent the program.

A program according to an exemplary embodiment can implement one of the methods during its performing, for example, such that the program reads storage locations or writes one or more data elements into these storage locations, wherein switching operations or other operations are induced in transistor structures, in amplifier structures, or in other electrical, optical, or magnetic components, or components based on another functional principle. Accordingly, data, values, sensor values, or other program information can be captured, determined, or measured by reading a storage location. By reading one or more storage locations, a program can therefore capture, determine or measure sizes, values, variable, and other information, as well as cause, induce, or perform an action by writing in one or more storage locations, as well as control other apparatuses, machines, and components, and thus for example also perform complex processes using actuators.

The above-described exemplary embodiments represent only an illustration of the principles of the present invention. It is understood that modifications and variations of the arrangements and details described herein will be clear to other persons of skill in the art. It is therefore intended that the invention be limited only by the scope of the following patent claims, and not by the specific details which have been presented with reference to the description and the explanation of the exemplary embodiments.

The features disclosed in the foregoing description, the following claims, and the accompanying Figures can be meaningful and can be implemented both individually as well as in any combination for the realization of an exemplary embodiment in its various embodiments.

REFERENCE NUMBER LIST

100 Tire monitoring system
110 Module
120 Connector
130 Flexible cable
140 Information signal
150 Discrete component
160 Surface
170 Detection section/portion
180 Supply-line component
190 Channel
200 Opening
210 Seal
220 Seal lip
230 Sealing space
240 External space
250 Attachment component
260 Circuit board
270 Circuit
280 Spacer
290 Location
300 Bore
310 Predetermined direction
320 Projection direction
330 Component
340 Energy source
350 Partial housing
360 Recess
370 Encapsulation mass
380 Sealing structure
390 Counter-sealing structure
400 Housing
410 Direction
420 External space
430 Cable feeding section
440 Partial cable
450 Contact location
460 Reference point
470 Curved course
480 Line
490 Support component
500 Region
510 Attachment structure
520 Tire valve interface
530 Valve extension nut
540 Valve insert
550 Region
560 End cap
570 Valve
580 Radial turning lock
590 Axial turning lock
595 Flank
600 Valve seat
610 Surface
620 Supply-line section
630 Recess
640 Spacer component
650 Preloading structure
660 Contact structure
670 Opening
680 Bore
690 Inner surface
700 Guide recess
710 Bore
720 Contact structure
730 Environment
740 Main surface
750 Guide structure
760 Seal edge
770 Screw element
780 Bore
800 Holder
810 Screw
820 Bore

The invention claimed is:

1. A module comprising:
a first partial housing and a second partial housing, wherein the first partial housing and the second partial housing together form a recess;
a circuit board disposed in the recess; and
an encapsulation mass, which closes the recess,
wherein a material from which the first partial housing is manufactured and a material from which the second partial housing is manufactured have a difference in thermal expansion coefficients that is at most 10% of the largest value of the two thermal expansion coefficients:
wherein the first partial housing includes a sealing structure and the second partial housing includes a counter-sealing structure: and
wherein at least one of the sealing structure or the counter-sealing structure is configured to extend into the other of the sealing structure and the counter-sealing structure,
wherein the first partial housing and the second partial housing each include a cable feeding section, which the cable feeding sections are configured to introduce a flexible cable at least to the recess, and wherein the sealing structure and the counter-sealing structure are disposed on the cable feeding sections of the first partial housing and of the second partial housing respectively,
further comprising at least one partial cable provided for guiding a signal, the partial cable being indirectly or directly electrically connected to a contact terminal of the circuit board, the contact terminal being disposed on the circuit board, wherein in an area of the contact terminal on the surface of the circuit board, the circuit board includes no electrically conductive structures that are not directly electrically connected to the contact terminal.

2. The module according to claim 1, wherein the sealing structure includes at least one elevation, or least one depression, or at least one elevation and at least one depression.

3. The module according to claim 2, wherein the at least one elevation is asymmetric or the at least one depression is asymmetric or the at least one elevation and the at least one depression are asymmetric.

4. The module according to claim 1, wherein the sealing structure includes a plurality of elevations disposed one-behind-the-other or a plurality of depressions disposed one-behind-the-other or a plurality of elevations and a plurality of depressions disposed one-behind-the-other.

5. The module according to claim 1, wherein the area around the contact terminal extends on a main surface of the circuit board at least 3 mm in all directions beyond the contact terminal.

6. The module according to claim 1, wherein the at least one partial cable has a curved section between a first reference point and a second reference point, wherein the first and the second reference points lie in a volume that is defined by the first housing part, the second housing part, and the encapsulation mass.

7. A tire pressure monitoring system including the module of claim 1.

8. A module comprising:
a first partial housing and a second partial housing, wherein the first partial housing and the second partial housing together form a recess;
a circuit board disposed in the recess; and
an encapsulation mass, which closes the recess,
wherein a material from which the first partial housing is manufactured and a material from which the second partial housing is manufactured have a difference in thermal expansion coefficients that is at most 10% of the largest value of the two thermal expansion coefficients:
wherein the first partial housing includes a sealing structure and the second partial housing includes a counter-sealing structure: and
wherein at least one of the sealing structure or the counter-sealing structure is configured to extend into the other of the sealing structure and the counter-sealing structure, and
wherein the first partial housing and the second partial housing each include a cable feeding section, which the cable feeding sections are configured to introduce a flexible cable at least to the recess, and wherein the sealing structure and the counter-sealing structure are disposed on the cable feeding sections of the first partial housing and of the second partial housing respectively,
and further comprising at least one partial cable provided for guiding a signal, the partial cable being indirectly or directly electrically connected to a contact terminal of the circuit board,
wherein the at least one partial cable comprises a sheath materially-bonded with at least one of the first partial housing, the second partial housing, and the encapsulation mass.

9. The module according to claim 8, wherein the sealing structure includes at least one elevation, or least one depression, or at least one elevation and at least one depression.

10. The module according to claim 9, wherein the at least one elevation is asymmetric or the at least one depression is asymmetric or the at least one elevation and the at least one depression are asymmetric.

11. The module according to claim 8, wherein the sealing structure includes a plurality of elevations disposed one-behind-the-other or a plurality of depressions disposed one-behind-the-other or a plurality of elevations and a plurality of depressions disposed one-behind-the-other.

12. The module according to claim 8, wherein the area around the contact terminal extends on a main surface of the circuit board at least 3 mm in all directions beyond the contact terminal.

13. The module according to claim 8, wherein the at least one partial cable has a curved section between a first reference point and a second reference point, wherein the first and the second reference points lie in a volume that is defined by the first housing part, the second housing part, and the encapsulation mass.

14. A tire pressure monitoring system including the module of claim 8.

15. A module comprising:
a first partial housing and a second partial housing, wherein the first partial housing and the second partial housing together form a recess;
a circuit board disposed in the recess; and
an encapsulation mass, which closes the recess,
wherein a material from which the first partial housing is manufactured and a material from which the second partial housing is manufactured have a difference in thermal expansion coefficients that is at most 10% of the largest value of the two thermal expansion coefficients:
wherein the first partial housing includes a sealing structure and the second partial housing includes a counter-sealing structure: and
wherein at least one of the sealing structure or the counter-sealing structure is configured to extend into the other of the sealing structure and the counter-sealing structure, and
wherein the first partial housing and the second partial housing each include a cable feeding section, which the cable feeding sections are configured to introduce a flexible cable at least to the recess, and wherein the sealing structure and the counter-sealing structure are disposed on the cable feeding sections of the first partial housing and of the second partial housing respectively,
and further comprising at least one partial cable provided for guiding a signal, the partial cable being indirectly or directly electrically connected to a contact terminal of the circuit board,
wherein the at least one partial cable comprises a sheath melted onto at least one of the first partial housing, the second partial housing, and the encapsulation mass.

16. The module according to claim 15, wherein the sealing structure includes at least one elevation, or least one depression, or at least one elevation and at least one depression.

17. The module according to claim 15, wherein the sealing structure includes a plurality of elevations disposed one-behind-the-other or a plurality of depressions disposed one-behind-the-other or a plurality of elevations and a plurality of depressions disposed one-behind-the-other.

18. The module according to claim 15, wherein the area around the contact terminal extends on a main surface of the circuit board at least 3 mm in all directions beyond the contact terminal.

19. The module according to claim 15, wherein the at least one partial cable has a curved section between a first reference point and a second reference point, wherein the first and the second reference points lie in a volume that is defined by the first housing part, the second housing part, and the encapsulation mass.

20. A tire pressure monitoring system including the module of claim 15.

* * * * *